US006686777B1

United States Patent
Karlquist

(10) Patent No.: US 6,686,777 B1
(45) Date of Patent: Feb. 3, 2004

(54) PHASE DETECTOR HAVING IMPROVED TIMING MARGINS

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/268,196

(22) Filed: Oct. 9, 2002

(51) Int. Cl.[7] .............................................. G01R 29/00
(52) U.S. Cl. ........................................................ 327/2
(58) Field of Search ................................ 327/2, 3, 7, 8, 327/9, 10, 12

(56) References Cited

U.S. PATENT DOCUMENTS 5,719,508 A * 2/1998 Daly ............................ 327/12
6,034,554 A * 3/2000 Francis et al. ................. 327/7
6,483,871 B1 * 11/2002 Dawe ......................... 375/226

OTHER PUBLICATIONS

Alexander, J., "Clock Recovery From Random Binary Signals," Electronic Letters, vol. 11, No. 22, (Oct. 30, 1975) pp. 541–542.

Hogge, C., "A Self Correcting Clock Recovery Circuit," Journal of Lightwave Technology, vol. LT-3, No. 6, (Dec. 1985) pp. 1312–1314.

Savoj, J. et al., "A 10'Gb/s CMOS Clock and Data Recovery Circuit with a Half Rate Linear Phase Detector," IEEE Journal of Solid-State Circuits, vol. 36, No. 5, (May 2001) pp. 761–767.

Reis, A. et al., "High Date Rate Synchroizers Operating at Low Speed," 8th IEEE International Conference on Electronics, Circuits and Systems (2001) pp. 1127–1130.

* cited by examiner

Primary Examiner—Jeffrey Zweizig

(57) ABSTRACT

Phase detector constructed from a plurality of multi-input gates which combine combinations of unretimed input data with retimed data and with clock signals to achieve output pulses proportional to the phase difference between the unretimed data and the clock. In the embodiment the phase detector comprises an input for receiving data signals; an input for receiving clock signals; an output for providing phase control signals; data retiming circuitry for accepting unretimed data signals from said data input and for providing even and odd retimed signals therefrom; a plurality of multi-input gates having inputs connected to different combinations of said unretimed data signals, said retimed data signals, and said clock signals, such that no said gate can be active in two consecutive UIs, when a UI is defined as the length of time allocated to a single bit; and a combiner for mixing the outputs of at least two of said gates.

65 Claims, 20 Drawing Sheets

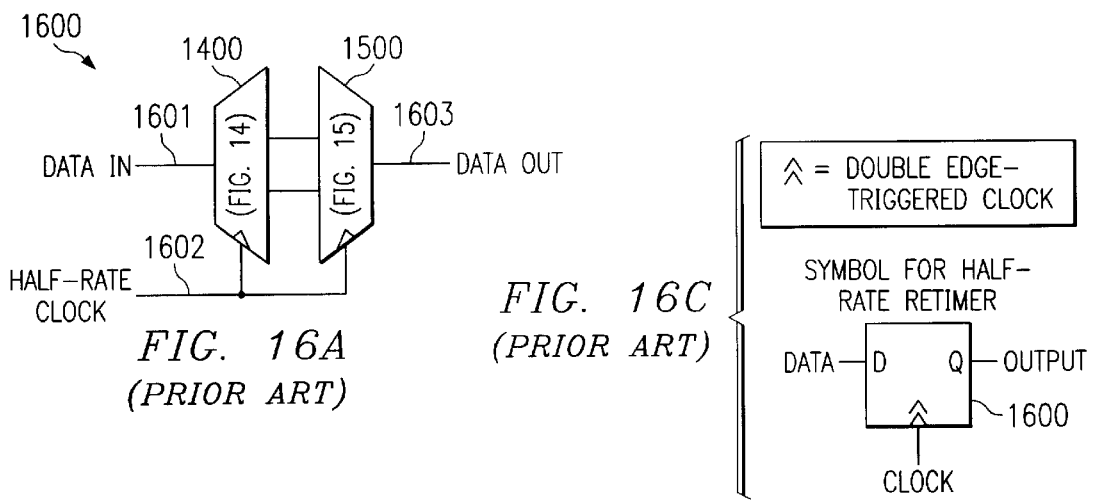
FIG. 16A (PRIOR ART)
FIG. 16C (PRIOR ART)
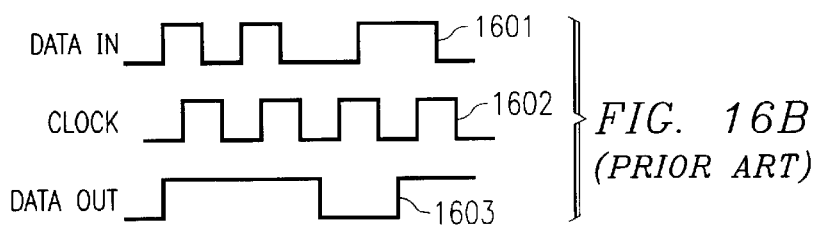
FIG. 16B (PRIOR ART)
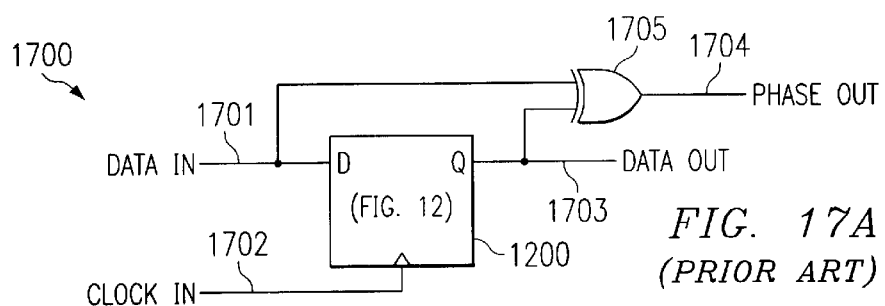
FIG. 17A (PRIOR ART)
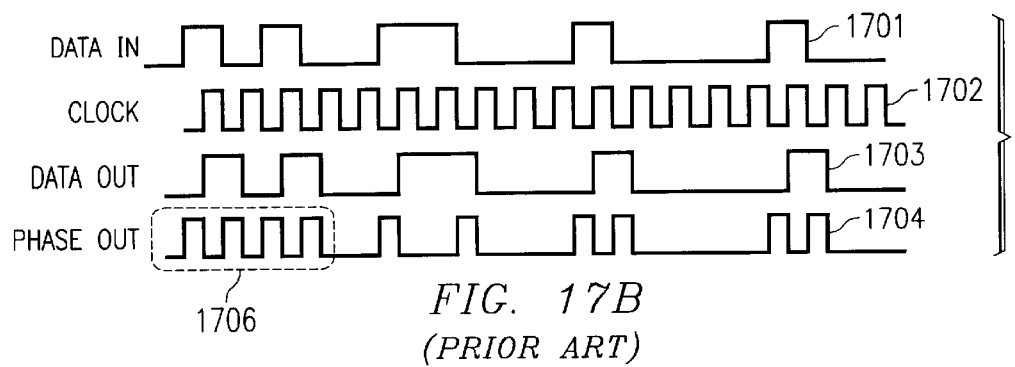
FIG. 17B (PRIOR ART)

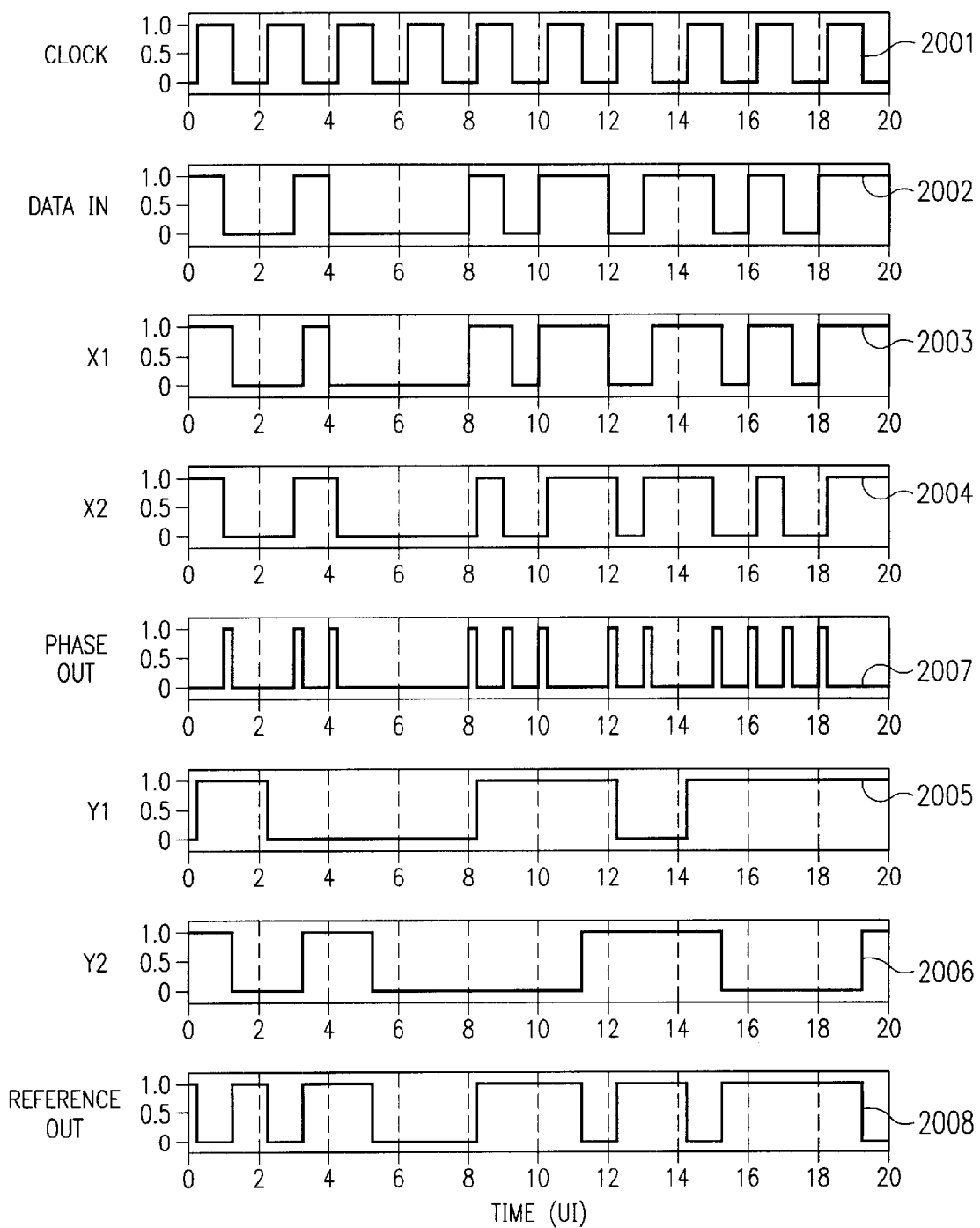

PHASE DETECTOR HAVING IMPROVED TIMING MARGINS

TECHNICAL FIELD

This invention relates to phase detectors and more particularly to a system and method for clock recovery from non-return-to-zero (NRZ) data and even more particularly to such a system and method for an improved timing margin half-rate continuous phase detector.

BACKGROUND

In data transmission systems using NRZ formatting, there is no explicit clock signal transmitted with the data that can be used to recover the data. The clock must first be recovered from the data, based on the time of the data transitions. This requires a phase detector which measures the phase error between the NRZ data and an internal clock, producing an error signal. The error signal drives a control loop that corrects the error. In a properly working system, the control loop will be able to hold the phase error to a negligible value. The recovered clock is then used to recover the data. A circuit which performs the above operations is called a clock/data recovery (CDR) circuit. Nearly all modern data transmission systems use CDR circuits and the phase detector is an essential part of such a CDR circuit.

Two classes of phase detectors are in common use, commonly referred to as "bang-bang" and "continuous." The bang-bang circuits are derived from Alexander's original design, as discussed in Alexander, J D H, "Clock Recovery from Random Binary Signals," Electronic Letters, v. 11, n. 32, pp 541–542, Oct. 30, 1975. The bang-bang class has a binary quantized output that only indicates whether the clock is "early" or "late," but not by how much. This results in the control loop operating in a discontinuous or "bang-bang" mode, which adds spurious jitter to the recovered clock and thus argues against the use of bang-bang phase detectors in jitter measurement systems. Also, in communications systems, this spurious jitter reduces the performance of the system.

The continuous phase detectors are patterned after, or emulate, Hogge's original design as discussed in Hogge, C P, "A Self Correcting Clock Recovery Circuit," Journal of Lightwave Technology, v. LT-3, n. 6, pp 1312–1314, December 1985. These detectors have an output that can be used to generate a voltage proportional to phase error, thus resulting in a "proportional" mode for the control loop. This is much more desirable in operational systems and essential in jitter measurement systems. However, many systems operating at state-of-the-art clock rates still use bang-bang phase detectors because they will operate considerably faster than continuous phase detectors, for a given logic hardware technology. This is because the timing is more critical in the continuous phase detectors of known design.

The phase detectors described above are clocked at "full rate," meaning that the clock frequency is equal to the baud rate of the data. For example, if the data is at a 10 Gbit/s rate ($10^{10}$ baud), and the clock is 10 GHz, the circuit is described as being clocked at "full rate." In this context, "half rate" clocking would refer, for example, to 10 Gbit/s data with a 5 GHz clock.

In an effort to get more speed, "half-rate" clocked continuous phase detectors have been developed as discussed by Reis, A D, et al, "High Date Rate Synchronizers Operating at Low Speed." KEGS 2001. $8^{th}$ IEEE International Conference on Electronics, Circuits and Systems, 2001, pp 1127–1130, V3 and Savoj, J and Razavi, B, "Design of Half-Rate Clock and Data Recovery Circuits for Optical Communications Systems, IEEE Journal of Solid-State Circuits, V36, No, 5, May 2001, pp 761–768. The clock has two phases, 180° apart, which activate duplicate flip-flops. The 2 phases correspond to the rising and falling edges of the clock waveform. This modification, potentially at least, gives the flip-flops twice as much time to switch, and thus enables up to twice the maximum clock rate. However, these half-rate phase detectors still have limitations with respect to critical timing margins that limit their maximum clock rate. It should also be noted, that because of the analog nature of continuous phase detectors, their accuracy and dynamic range gradually deteriorate as the maximum rate is approached. Therefore, even below the maximum rate, increased design margin usually improves performance. These increased margins then effectively increase the maximum data rate. Accordingly, a need exists in the art for a half-rate continuous phase detector with improved timing margins for increased speed and performance.

BRIEF SUMMARY

The present invention is directed to a phase detector constructed from a plurality of multi-input gates which combine combinations of unretimed input data with retimed data and with clock signals to achieve output pulses proportional to the phase difference between the unretimed data and the clock.

In the embodiment the phase detector comprises an input for receiving data signals; an input for receiving clock signals; an output for providing phase control signals; data retiming circuiting for accepting unretimed data signals from said data input and for providing even and odd retimed signals therefrom; a plurality of multi-input gates having inputs connected to different combinations of said unretimed data signals, said retimed data signals, and said clock signals, such that no said gate can be active in two consecutive UIs, when a UI is defined as the length of time allocated to a single bit; and a combiner for mixing the outputs of at least two of said gates.

The forgoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart form the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended. as a definition of the limits of the present invention.

BRIEF DESCRIPTION

For a more complete understanding of the present invention, reference is now made to the following descriptions taken in conjunction with the accompanying drawing, in which.

Figure 10A:
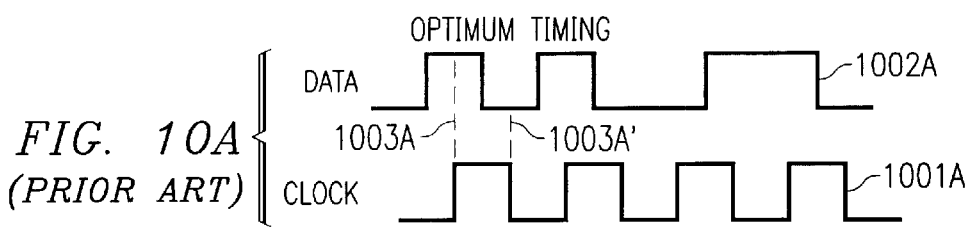
Figure 10B:
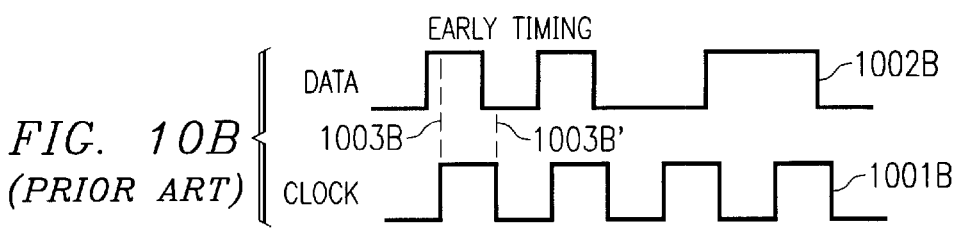
Figure 10C:
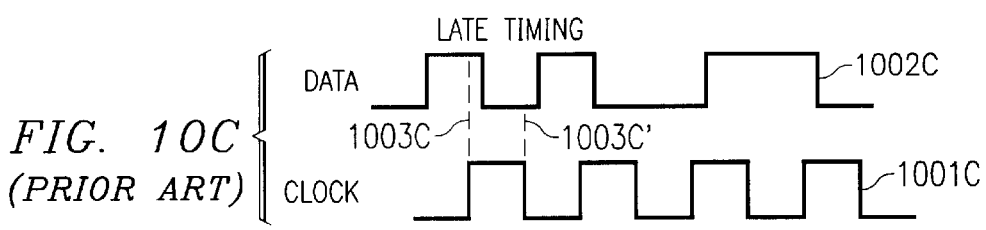
Figure 11A:
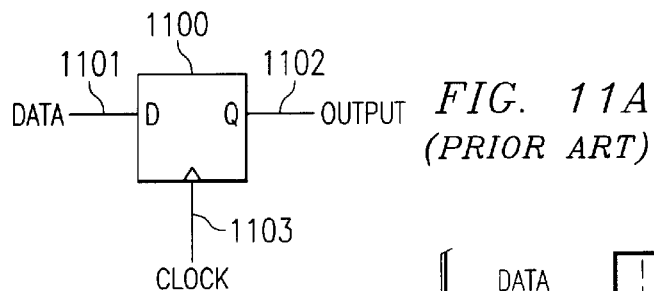
Figure 11B:
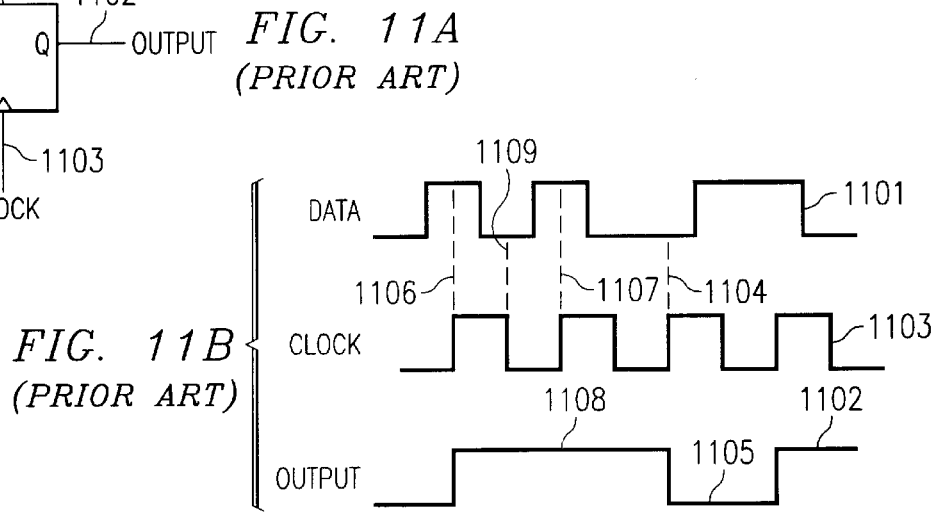
Figure 12A:
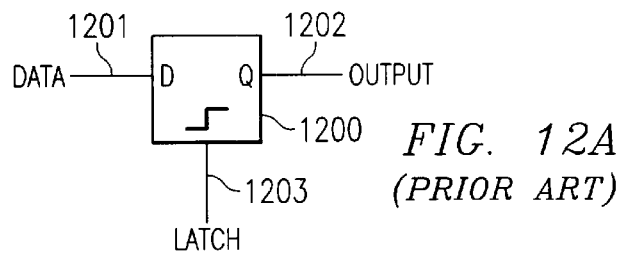
Figure 12B:
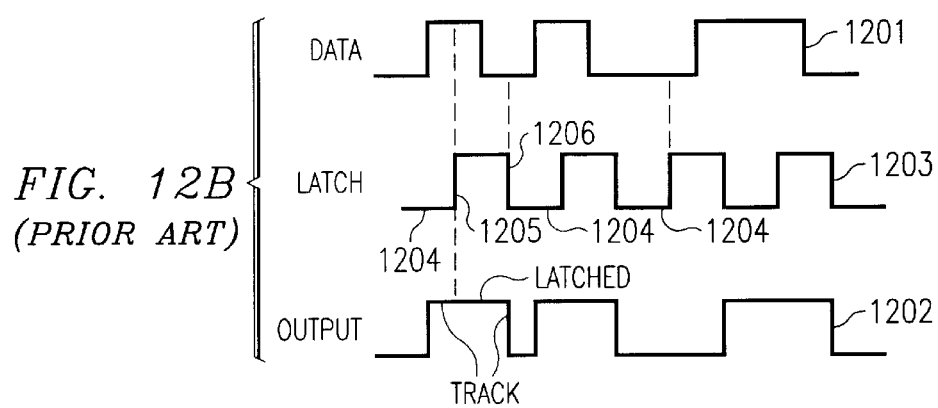
Figure 13:
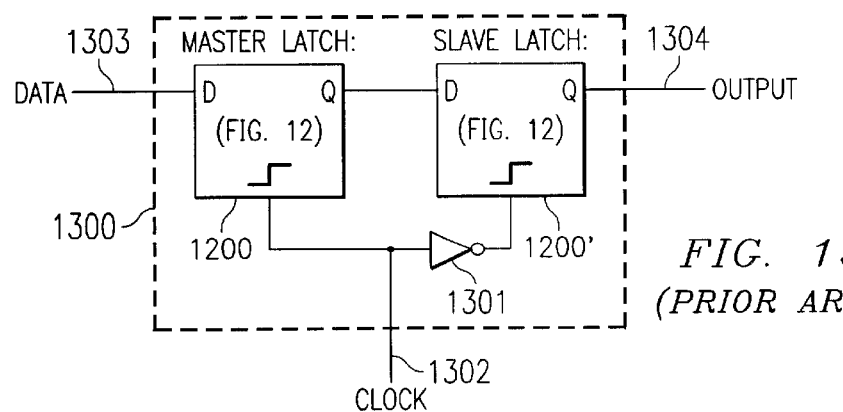
Figure 14A:
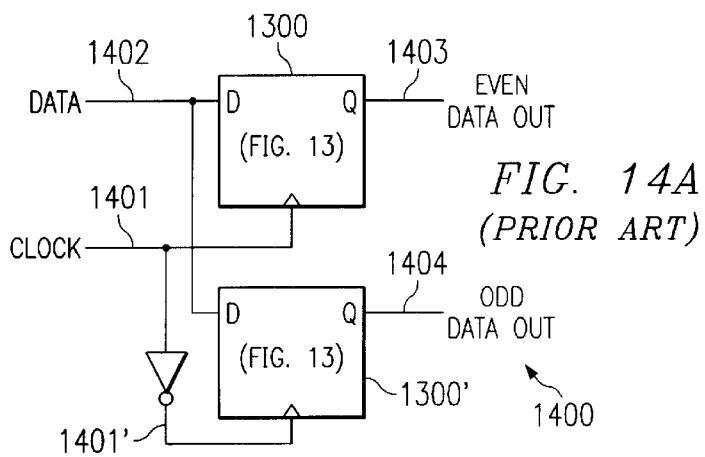
Figure 14C:
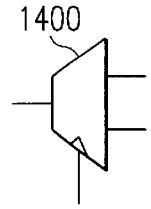
Figure 14B:
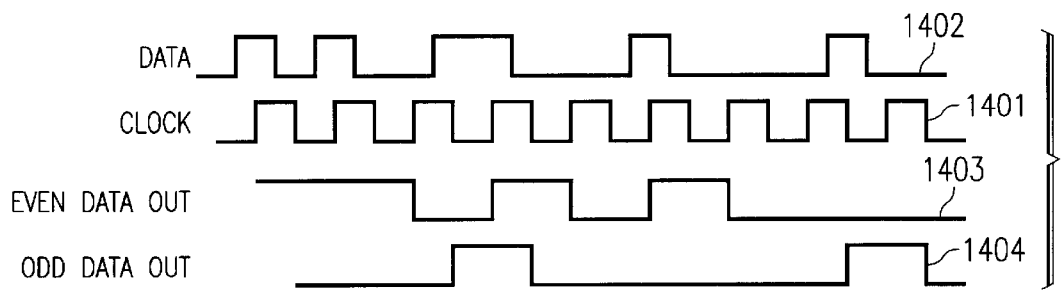
Figure 15A:
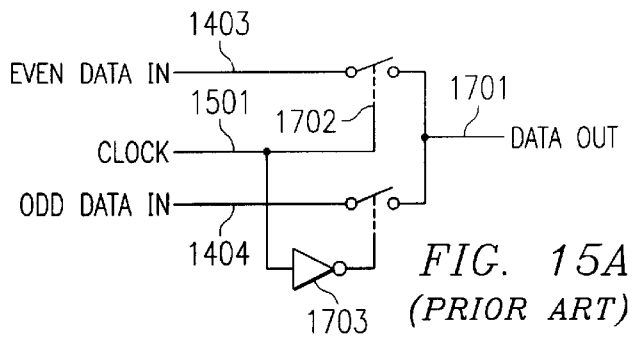
Figure 15C:
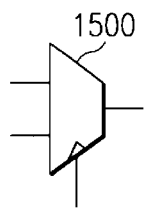
Figure 15B:
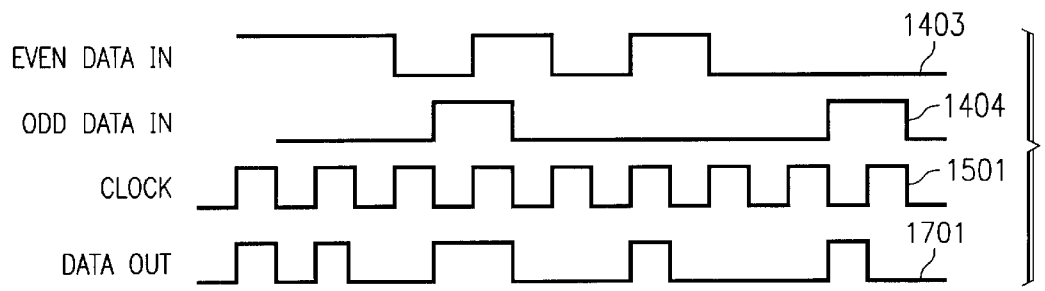
Figure 18A:
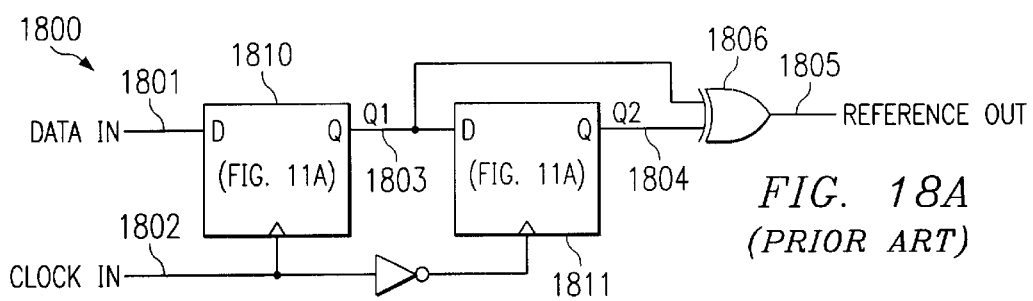
Figure 18B:
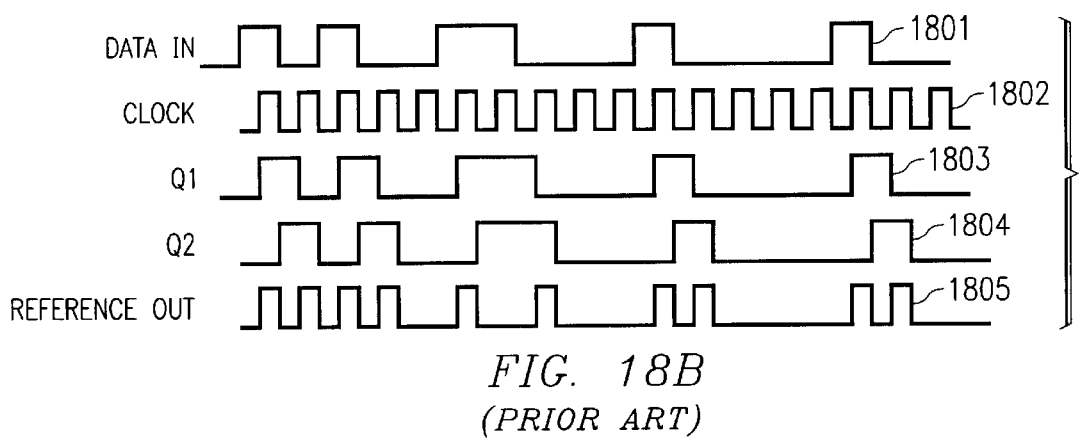
Figure 19A:
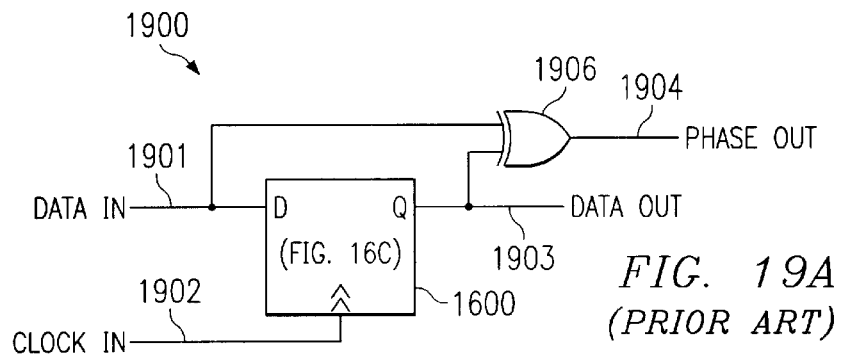
Figure 19B:
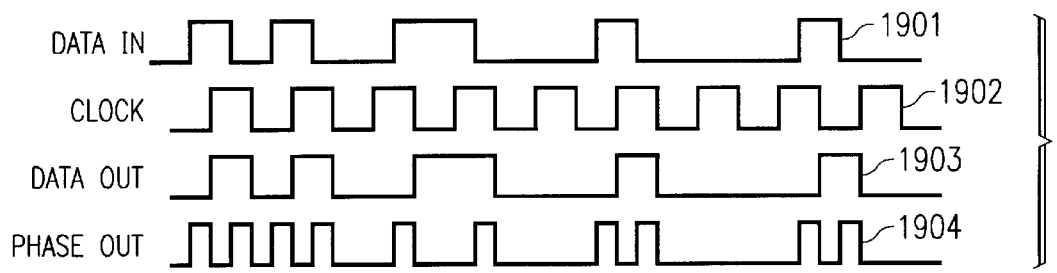

FIGS. 10A, 10B, and 10C show prior art timing diagrams for half-rate clock;

FIGS. 11A and 11B show prior art flip-flop timing;

FIGS. 12A and 12B show prior art later timing;

FIG. 13 shows prior art master/slave flip-flip constructed from two latches;

FIGS. 14A, 14B, and 14C show a prior art multiplexer and its timing;

FIGS. 15A, 15B, and 15C show a prior art demultiplexer and its timing;

FIGS. 16A, 16B, and 16C show a prior art half-rate retimer and its timing;

FIGS. 17A, 17B, 17C and 17D show a prior art phase detector and its timing;

FIGS. 18A and 18B show a prior art reference output and its timing;

FIGS. 19A and 19B show a prior art half-rate phase detector and its timing;

FIGS. 20A, 20B, 20C and 20D show a prior art half-rate phase detector and its timing.

DETAILED DESCRIPTION

Before beginning the detailed description it may be helpful to discuss the ramifications of clock phase as it relates to the task of correctly recovering data. The discussion which follows are with reference to FIGS. 9A–20D, all of which are provided by way of background.

Figure 9A:
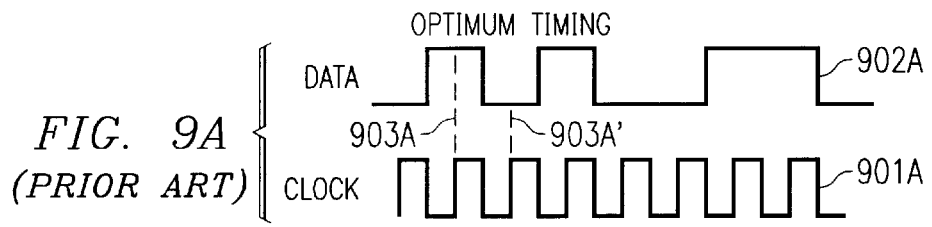
FIGS. 9A, 9B and 9C show prior art timing diagrams for full-rate clock.
Figure 9B:
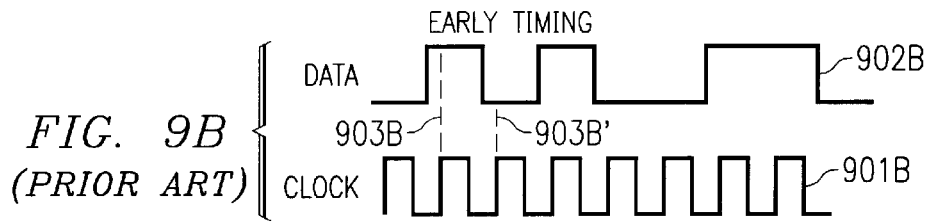
Figure 9C:
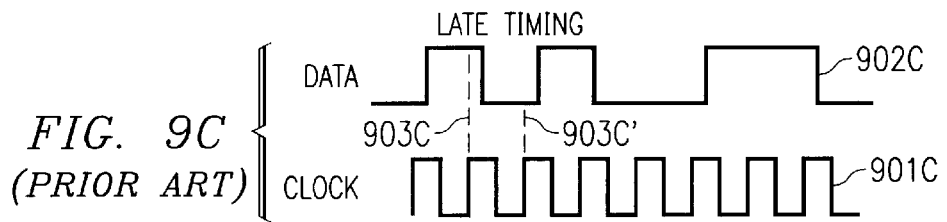

FIGS. 9A, 9B and 9C are timing diagrams for full-rate operation showing clock waveforms 901A, 901B, and 901C idealized as a square wave, and data 902A, 902B, and 902C idealized as instantaneously changing state at each bit boundary. The length of time allotted for a single bit is called a unit interval (UI). The optimum time to sample the data is at the center of the UI representing the bit, as shown by 903A and 903A', in FIG. 9A. With this approach, the design margin for timing errors will be the same for positive errors as negative errors. FIG. 9B shows sample time 903B and 903B' as being early, and FIG. 9C shows sample time 903C and 903C' as being late.

The data is normally captured by an edge-triggered D-type flip-flop, which can be thought of as a sampler that samples the data at the time of a positive going transition of the clock (903A, 903B, 903C). Thus the clock and data transitions should be spaced ½ UI apart.

In actual systems, there is some dead time when the data is transitioning, and thus not yet valid. This reduces the timing margin below ½ UI, but the principle remains the same: the optimum time to sample the data is in the center of the time interval in which the data is valid.

FIGS. 10A, 10B and 10C are similar to FIGS. 9A, 9B and 9C, except they show the half-rate clock operation. In this case, data 1002A, 1002B, and 1002C are sampled at every clock transition 1003A, 1003A', 1003B, 1003B', 1003C, and 1003C', whether positive or negative. Of course, clock transitions of clock signal 1001A, 1001B and 1001C, are 1 UI apart.

Jitter refers to variation in the clock phase (the relationship of the clock signal to the data signal) from bit to bit. If clock phase is thought of statistically as a random variable, then jitter is a measure (similar to variance) of the "randomness" of the variable. While the clock phase may be correct on the average, it can vary considerably for any particular bit. If a jittery data signal is sampled at uniform intervals, instead of the sampling taking place in the middle of a bit, it will be early some of the time and late some of the time. This timing error makes the system more vulnerable to bit errors due to noise and other impairments.

Another way of thinking of jitter is to consider clock phase to be a signal. Then jitter represents noise added to this phase signal. Jitter is closely related to "phase noise," which is a measure of spurious phase modulation of a sine wave.

There are basically two sources of jitter. A straightforward jitter mechanism is that the clock signal itself has jitter on it, and the device generating the data will inherit this jitter. This jitter mechanism is independent of the characteristics of the data being transferred. A second jitter mechanism is called "data pattern jitter." In this case, the timing of data will be corrupted while passing through a data transfer device due to group delay impairments in the device, which occur even in the presence of a perfect clock. Its name derives from the fact that the characteristics of the jitter depend on the characteristics of the data being transferred.

It is important to keep in mind that phase detectors are built from hierarchically organized combinations of circuit blocks, rather than as being an unrelated collections of gates and other elements.

FIG. 11A shows D flip-flop 1100 (henceforth referred to simply as a "flip-flop"), and FIG. 11B shows its timing diagram. The basic function of flip-flop 1100 is to take in data 1101 at the D input and send the data back out of the Q output to output lead 1102, under the control of clock 1103. At positive clock transition 1104 (FIG. 11B), if the D input is low, the output will go low 1105 (or stay low if it was already low). Similarly, if the D input is high at a positive clock transition 1106, 1107, the output will go high 1108 (or stay high if it was already high). At the time of negative clock edge 1109, the flip-flop does nothing.

A flip-flop can be thought of as a data retimer. Suppose the unretimed data at the D input to the flip-flop has a moderate amount of jitter on it. The flip-flop will, in general, sample the data at non-optimum times, but will still arrive at the correct value for each bit. It will then reproduce these bits at the output, however the timing of them will be controlled by the clock, not the time of arrival at the input. Thus a perfect flip-flop, with a perfect clock, will retime data so as to remove all jitter.

Unfortunately, if the clock has jitter, the output will inherit this jitter. Also, if the flip-flop has frequency-dependent amplitude or group delay, the output will have pattern jitter. Therefore, in practice, a flip-flop may either increase or decrease jitter.

For purposes of discussion herein, the input data to a flip-flop will be referred to as "unretimed data" and the output data from a flip-flop will be referred to as "retimed data".

FIG. 12A shows D latch 1200 (henceforth referred to simply as a "latch") and FIG. 12B show its timing diagram. Latches are important in general because they are building blocks for flip-flops and specifically because they are used explicitly in the aforementioned Savoj et al paper. Like the flip-flop, the basic function of the flip-flop is to take in data 1201 at the D input and send the data back out of Q output 1202. However, the latch is controlled by a latch input 1203 instead of a clock input, and its behavior is slightly different than a flip-flop. It has two modes, depending on the state of the latch input. When the latch input is low 1204, the latch is in track mode. Track mode is a straight-through transfer mode, in which the output responds immediately to the input. When the latch input goes high, the latch goes to latch mode. In latch mode, the output is latched in whatever state it had upon leaving track mode. Eventually, the latch input transitions from high to low 1206, returning the latch to track mode. At the instant of this transition, the output state immediately changes (if necessary) to be the same as the current input state, and follows any input changes after that.

FIG. 13 shows how flip-flop 1300 can be constructed using two latches 1200 and 1200' When made this way, it is called a master-slave flip-flop. Master latch 1200 operates from clock input 1302 and slave latch 1200' operates from the complement (via inverter 1301) of the clock input. Therefore, when the clock is low, the master tracks and the slave latches. When the clock goes high, the master latches and the slave tracks. Operation is as follows: the master latch latches the unretimed data 1303 on positive clock transitions, and feeds it to the slave latch. The slave latch, currently in track mode, passes the data through to the output. On the next negative clock edge, the slave latches the data at the output to hold it. Meanwhile, the master latch begins to track the current state of the unretimed data.

Because each bit requires 2 operations of the master-slave flip-flop, each operation must take place in less than ½ of a clock period. If a full rate clock is used, ½ of a clock period is ½ UI. This requires the constituent latches to be able to operate at twice the data rate. If a half rate clock is used, ½ of a clock period is 1 UI. This merely requires the constituent latches to be able to operate at the data rate.

A 1:2 demultiplexer (for the purposes of discussion herein) is a device that splits an unretimed data signal into two retimed output data signals, with the output data rate being half of the input data rate. Its basic function is to slow down data so that it can be processed at a lower rate by slower hardware.

FIGS. 14A and 14B show how demultiplexer 1400 (FIG. 14C) can be constructed from two flip-flops 1300 and 1300'. A half-rate clock 1401 is used for one flip-flop, (denoted "even"), and the complement of that half-rate clock 1401' is used for the other flip-flop, (denoted "odd"). Flip-flop 1300 samples unretimed data 1402 on positive going clock edges, while flip-flop 1300' samples unretimed data on negative going clock edges. The sampled data is at half the rate of the unretimed data. Retimed data is alternately transferred to "even" output 1403, then to "odd" output 1404. Thus, even numbered bits go to the even output and odd numbered bits go to the odd output.

A 2:1 multiplexer does the reverse operation by combining two half-rate data inputs into one full rate data input. FIGS. 15A and 15B show that 2:1 multiplexer 1500 (FIG. 15C) is simply a data selector switch driven by a half-rate clock. When half-rate clock 1501 is high, one input is switched through to output 1701; when the clock is low, the other input is switched through to output 1701. The complementary clock signals are generated by inverter 1703. The data switch is easily constructed using combinatorial logic. A multiplexer inherently retimes the data.

FIGS. 16A and 16B show that it is also possible to combine 1:2 demultiplexer 1400 with 2:1 multiplexer 1500 to form half-rate retimer 1600, the symbol for which is shown in FIG. 16C. The multiplexing function undoes the de-multiplexing function; the result is that the circuit merely retimes the data. Thus data in 1601 is retimed as data out 1603, as shown in FIG. 16B. It performs essentially the same function in terms of retiming data as a flip-flop; the main difference is that it operates from half-rate clock 1602, and the internal operation of the retimer is at half the rate of the flip-flop. Thus, it potentially can operate at a higher speed. A half-rate retimer is sometimes referred to as a double-edge triggered flip-flop because it responds to both positive and negative clock edges.

Figure 17C:
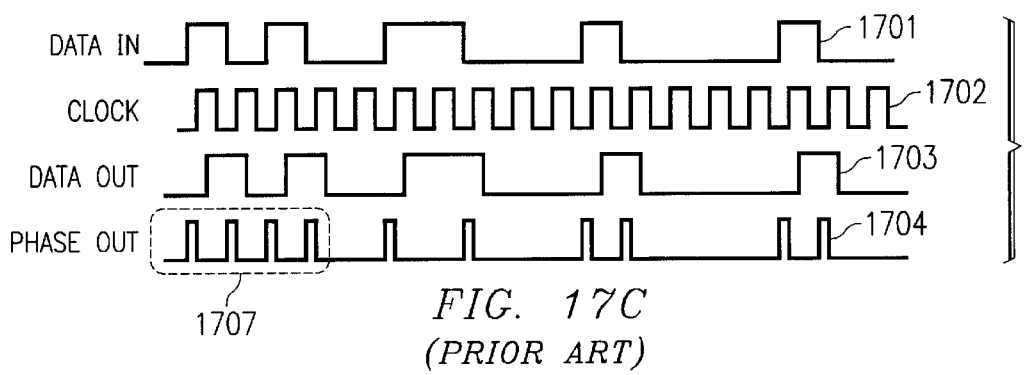
Figure 17D:
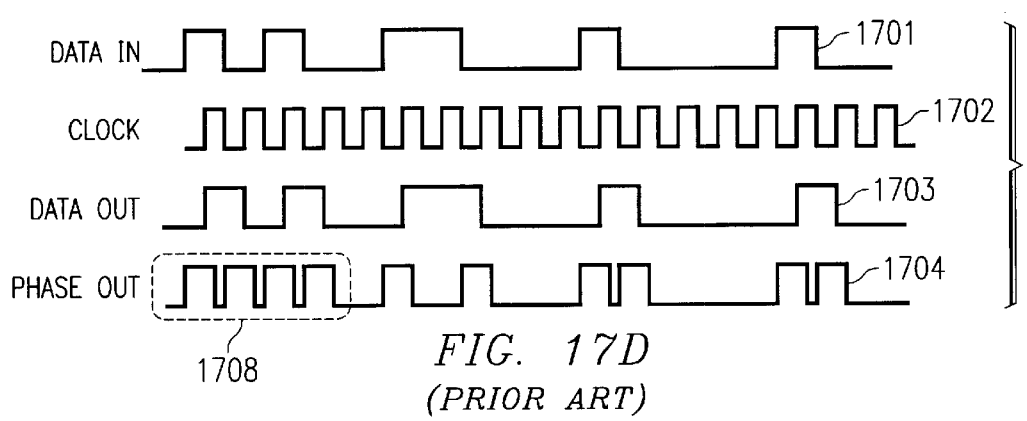

Circuit 1700 shown in FIG. 17A, retimes the unretimed data with a conventional flip-flop 1200 (FIG. 12), clocked at full rate by clock 1702. An exclusive-OR gate 1705 compares retimed data 1703 to unretimed data 1701. Output 1704 of the gate consists of pulses with duration proportional to the phase of clock 1702. A pulse is produced only when there is a data transition from which to gather phase information. For nominal clock phase, the pulses are ½ UI long, as shown by the pulses designated as 1706 in FIG. 17B. When the clock is early, the pulses narrow as shown by the pulses designated as 1707 on FIG. 17C. When the clock is late, the pulses widen, as shown by the pulses designated 1708 in FIG. 17D. The pulses can be smoothed by a low pass filter to produce a voltage proportional to phase.

Circuit 1700 has at least four serious limitations. (1). The flip-flop must operate at the full clock rate. (2). The effective data rate of the phase output is twice the data rate of the unretimed data. This immediately limits the maximum clock rate to half the maximum switching rate capability of the underlying logic technology. (3). When the phase deviates significantly from nominal in either direction, the phase output is called upon to put out extremely narrow width pulses. This constraint either limits the maximum usable phase range or further limits the maximum clock rate to even less than half of the maximum logic switching rate. (4). The circuit does not compare the unretimed data timing directly against the clock. Instead the unretimed data timing is compared against the retimed data at the output of the flip-flop. The retimed data serves as a proxy for the clock timing. Therefore, any jitter, propagation delay drift, or other inaccuracy inherent in the flip-flop degrades output accuracy. A significant, but often overlooked, source of error in flip-flops operating near their maximum rate is a dependence of propagation delay on the amount of set up time at the data input.

Since phase pulses are only produced at data transitions, the average value of the phase output depends on the average density of data transitions. Thus, the reference voltage representing zero phase error shifts according to the transition density. To counteract this problem, circuit 1800, shown in FIG. 18A adds an additional "reference" output 1805 that generates a shifting reference voltage that has the same dependency on data transition density, but is independent of phase. The reference output consists of pulses with fixed duration of ½ UI generated after each data transition. The reference output is subtracted from the phase output, resulting in a corrected output that is always zero (on the average) when the phase error is zero. The reference output, like the phase output, must operate at twice the rate of the unretimed data, which again limits the maximum clock rate. Also, the two flip-flops 1810, 1811 are operated on opposite phases of the clock, which allows only half the usual amount of time for propagation delay of first flip-flop 1810 and set-up/hold time of second flip-flop 1811. FIG. 18B shows the timing for circuit 1800 with respect to data in 1801, clocks in 1802, Q1 1803, Q2 1804, and reference out 1805. The output from flip-flops 1810, 1811 are supplied to exclusive OR (XOR) gate 1806.

Phase detector 1900 shown in FIG. 19A, replaces the full-rate flip-flop with half-rate retimer 1600. The operation of exclusive-OR gate 1906 to generate pulses 1903 having duration proportional to phase is identical to that described with respect to circuit 1700. The major advantage circuit 1900 over circuit 1700 is that the retiming function is now done at half-rate, which addresses limitation (1) discussed above. Limitations (2) through (4) remain. FIG. 19B shows the timing for circuit 1900 with respect to data in 1901, clock 1902, data out 1903 and phase out 1904.

Figure 20A:
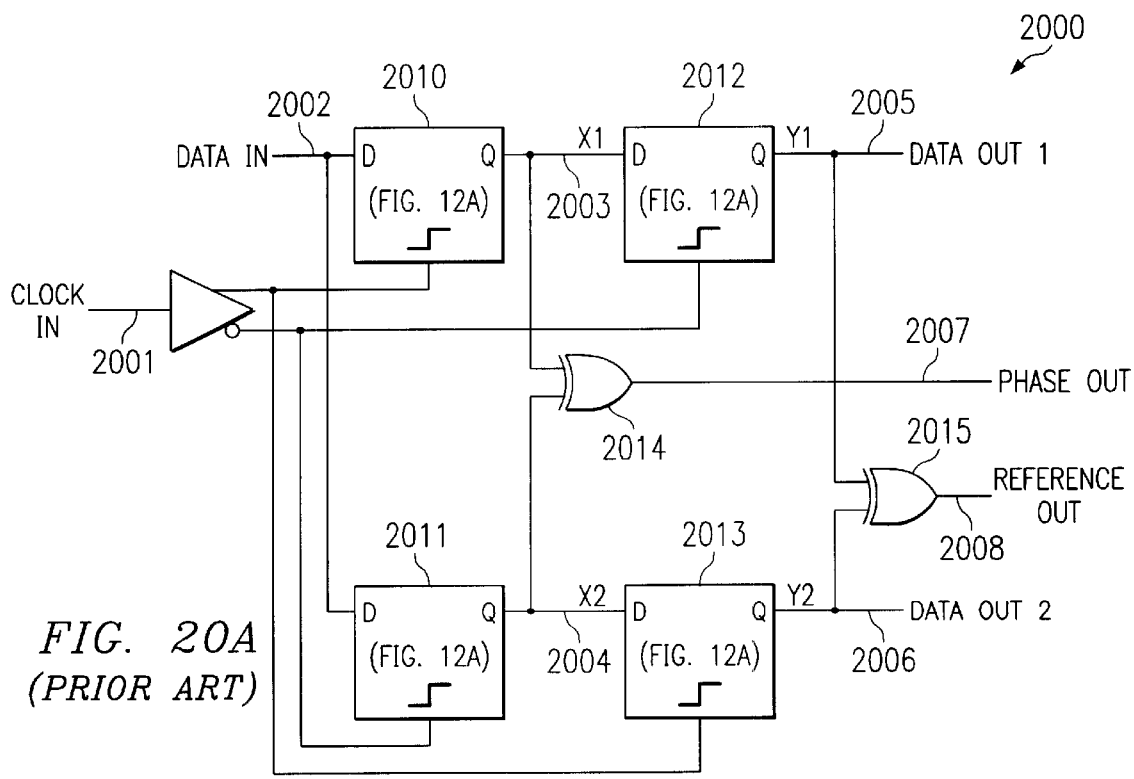
Figure 20B:
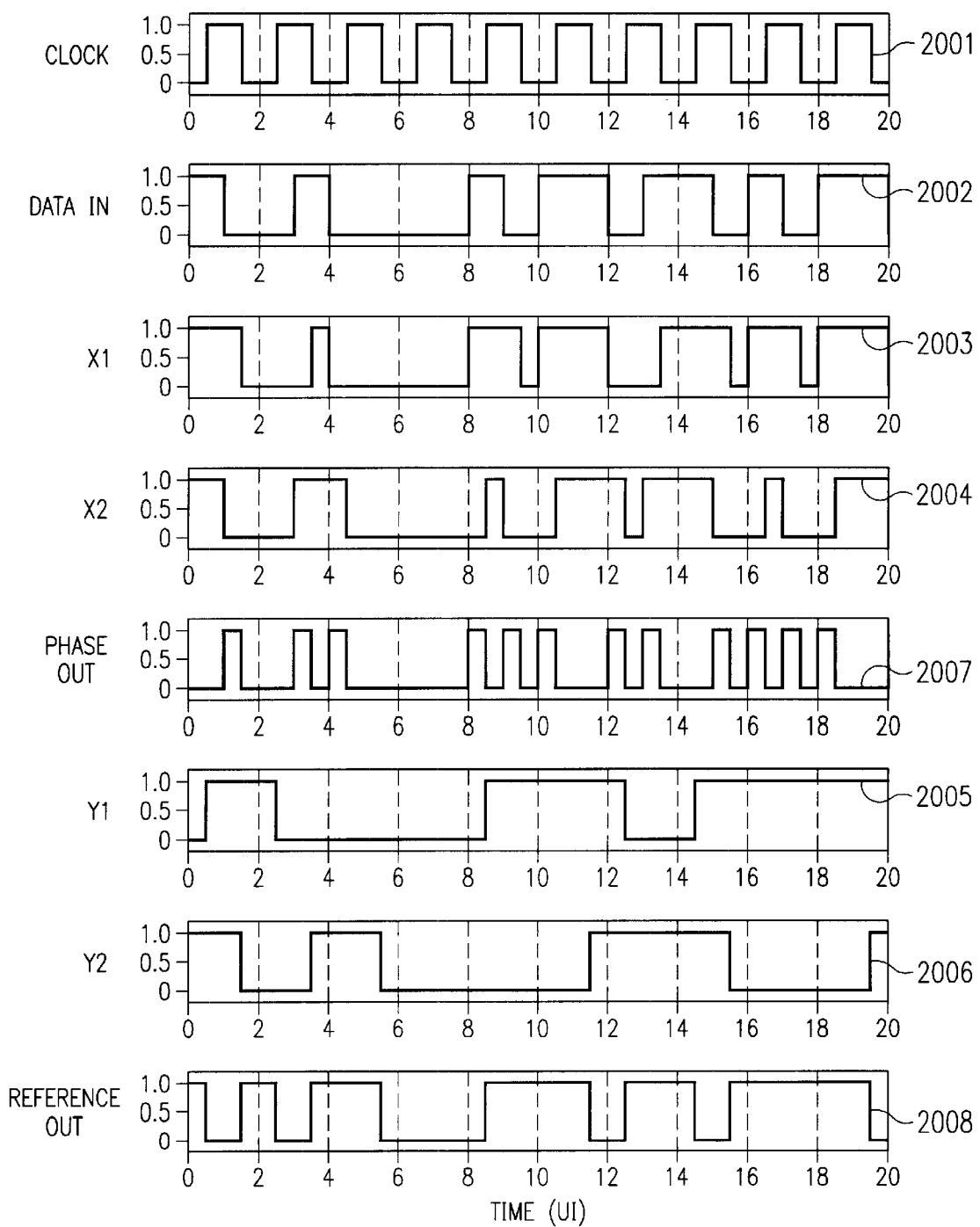

FIG. 20A shows the phase detector described in the above-identified Savoj et al reference, and FIG. 20B shows its timing diagram for optimum clock phase with respect to, clock 2001, data in 2002, Y1 2003, X2 2005, phase out 2007, Y1 2004, Y2 2006 and reference out 2008. The circuit operates from half-rate clock 2001. It uses four latches 2010–2012 organized into a 1:2 demultiplexer using the architecture previously described. The multiplexer outputs supply the recovered data, which also drives exclusive-OR gate 2015 to produce reference output pulses 2008. Note that these reference pulses are of 1 UI duration, in contrast to circuit 1800 in which they are of ½ UI duration. In addition, the two master latch outputs are brought out separately to another exclusive-OR gate 2014 that produces the phase output pulses 2007.

Although the latches are clocked at half-rate, FIG. 20B shows that the output of the latches 2007 contains ½ UI duration pulses. These pulses must then propagate through exclusive-OR gate 2015. When the clock phase is early, as shown in FIG. 20C, the pulse duration decreases to less than ½ UI. For large negative phase errors, the output pulse duration becomes impractically small, as shown by graph 2007, FIG. 20C and the output pulses are no longer accurately produced, resulting in phase detector measurement error.

Figure 20D:
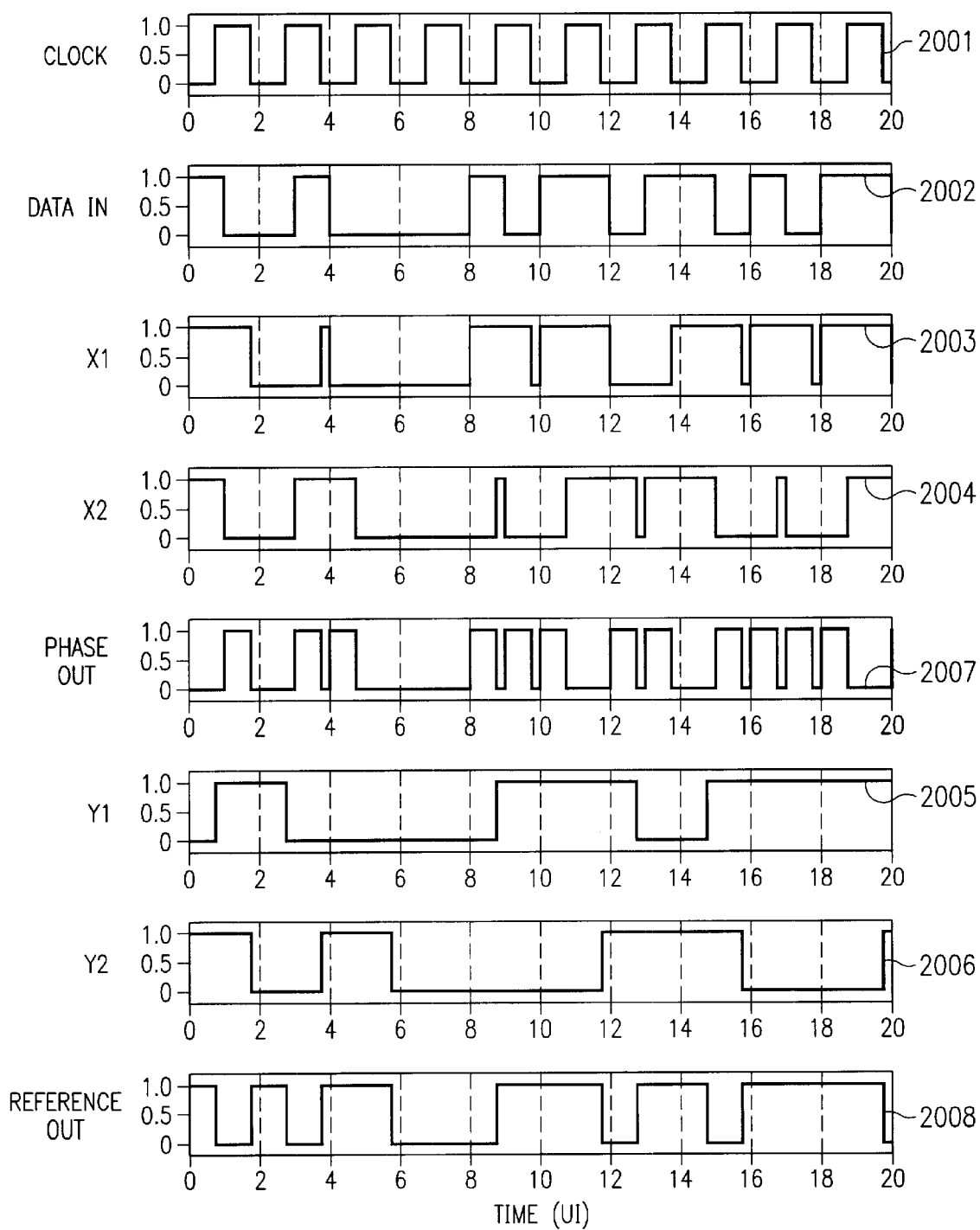

When the clock phase is late, as shown in FIG. 20D, the pulse duration increases to more than ½ UI. When there are consecutive output pulses, the gap between them decreases to less than ½ UI, as shown by graph 2007 FIG. 20D. This results in narrow negative going pulses. For large negative phase errors, the pulse duration becomes impractically small, and the output pulses are no longer accurately produced, again resulting in phase detector measurement error. In addition, in the late timing case, narrow pulses appear at nodes X1 and X2 (graphs 2003, 2004, FIG. 20D). These narrow pulses must propagate through the exclusive-OR gate. Extremely narrow pulses tend to change their duration after propagating through a gate. This change of duration is another source of inaccuracy.

The reference output works in a somewhat different manner than the phase detector. The even demultiplexed data is compared to the odd demultiplexed data by a second exclusive-OR gate. The gate produces a 1 UI pulse after each data transition. When these pulses are averaged, they produce exactly twice the voltage as the reference pulses of circuit 1800. Thus, in practice, this voltage is attenuated by a factor of 2 before being subtracted from the phase output. Because of the doubled pulse duration, the reference output actually attains the full benefit of the half-rate clocking.

The inventive concepts will now be described with respect to two embodiments, namely; a high performance embodiment, and an alternate embodiment, with lower performance.

Figure 1:
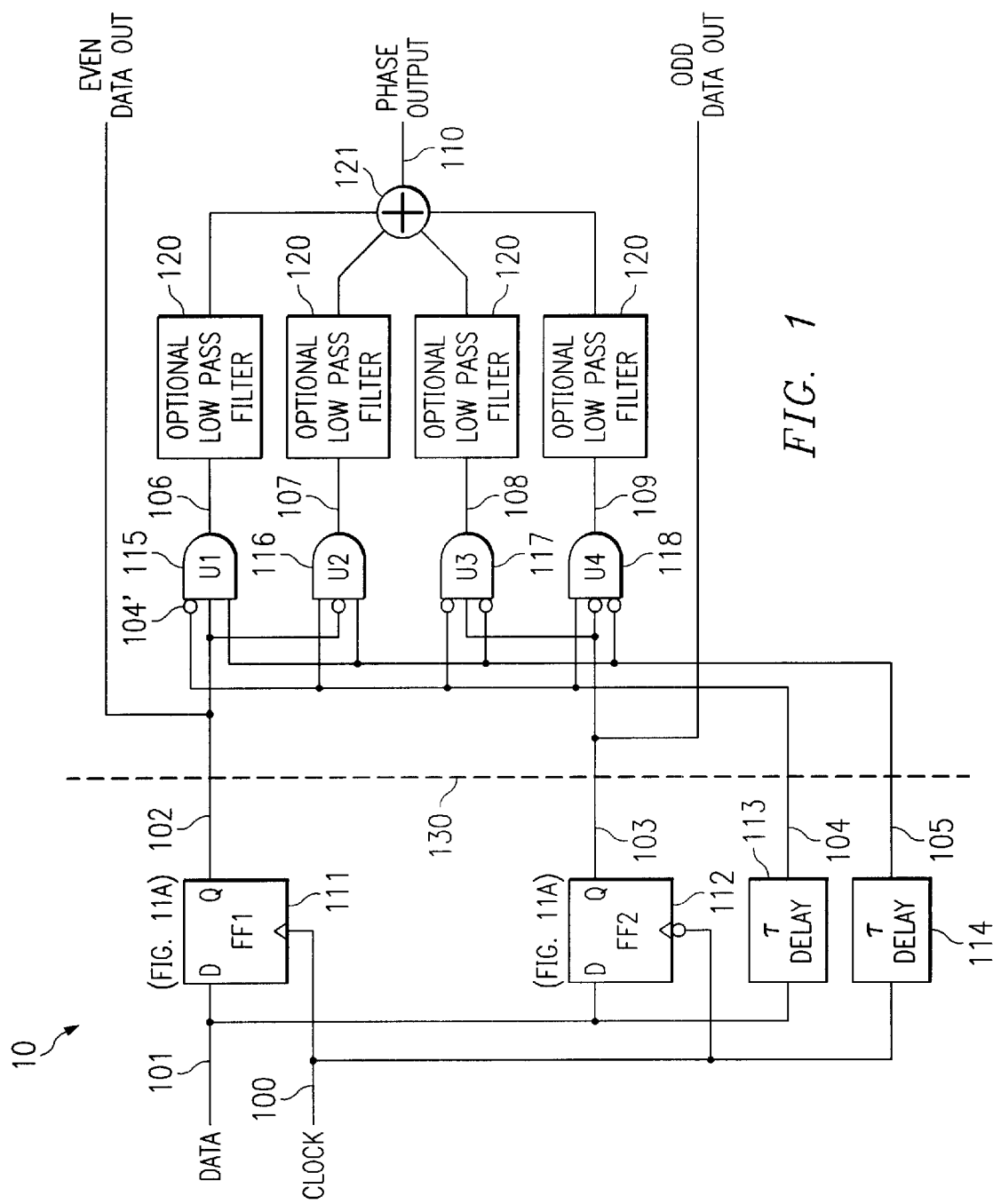
FIG. 1 shows one embodiment of an illustrative example of the invention.

FIG. 1 shows the schematic of a first embodiment 10. As in phase detector 2000 (FIG. 20A), the data recovery is done, for example, by a conventional half rate 1:2 demultiplexer, consisting of two flip-flops 111, 112 (FF1 and FF2) clocked on opposite clock edges of clock signal 100. However, in this case, the master latch outputs are not broken out separately. Instead, retimed data 102 is combined with delayed versions of unretimed data 113 and delayed versions of clock signal 105 by, in this embodiment, a bank of four 3-input AND gates 115, 116, 117, 118 (U1 through U4). The outputs of the gates are summed together by linear passive combiner 121 to form phase output 110. Note that in the drawing a "bubble" at the input of the AND gates denotes an inversion. Also note that all gates operate at half rate or less.

Figure 2:
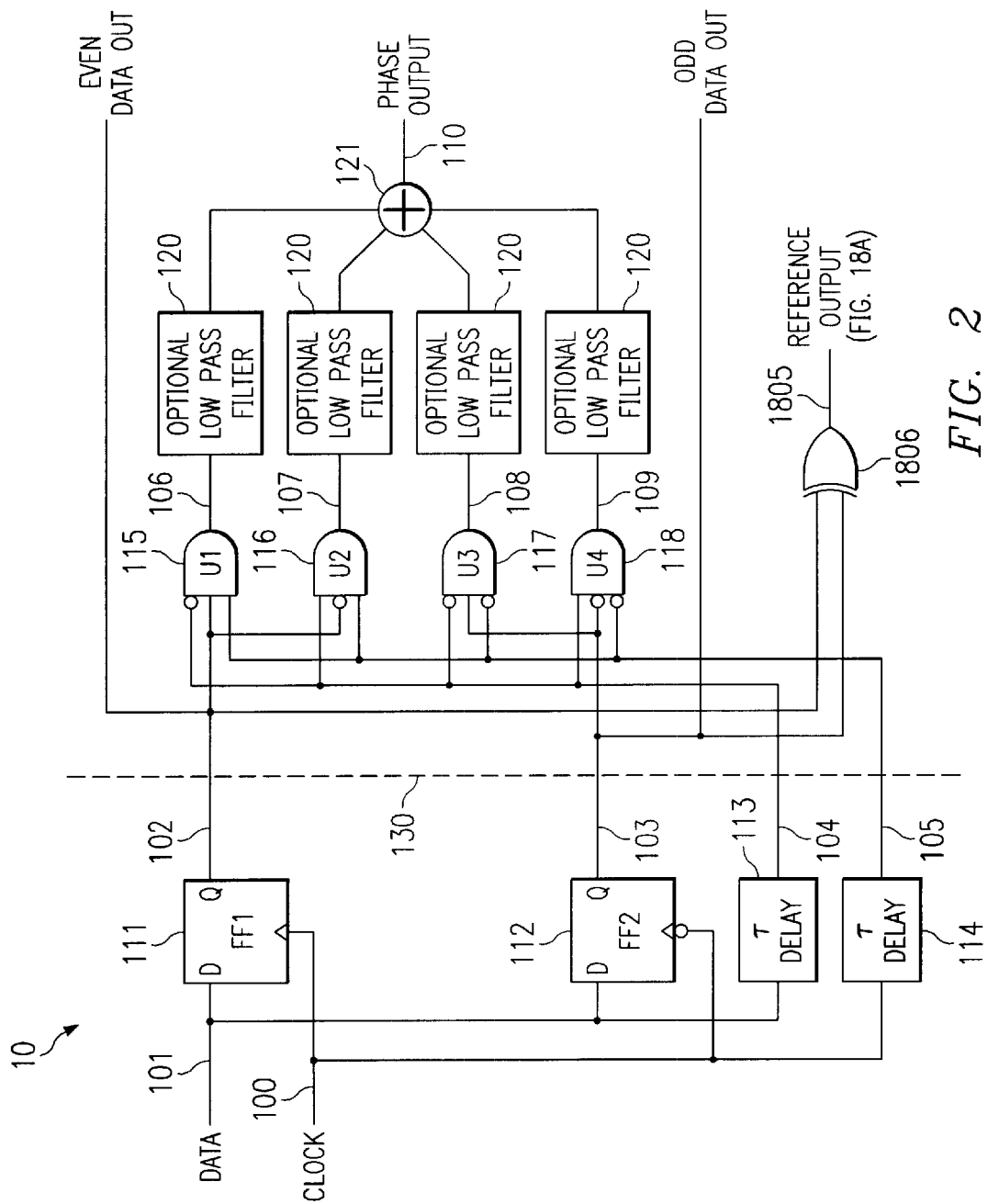
FIG. 2 shows the embodiment of FIG. 1 with the addition of a reference output.

FIG. 2 shows the addition of XOR gate 1806 to generate a reference output as described with respect to FIG. 18A. This gate (or other circuitry) may be conveniently added onto the circuit of FIG. 1 to make a complete working system, since both designs are based on a 1:2 demultiplexer.

Before describing the operation of the circuit 10, some definitions are necessary. Data bits that are valid during a positive clock edge are defined as "even" bits. Data bits that are valid during a negative clock edge are defined as "odd" bits. Data transitions that begin with an even bit and end with an odd bit are defined as "even transitions." Data transitions that begin with an odd bit and end with an even bit are defined as "odd transitions." Data transitions that begin with a 0 bit and end with a 1 bit are defined as "positive transitions." Data transitions that begin with a 1 bit and end with a 0 bit are defined as "negative transitions."

Figure 3A:
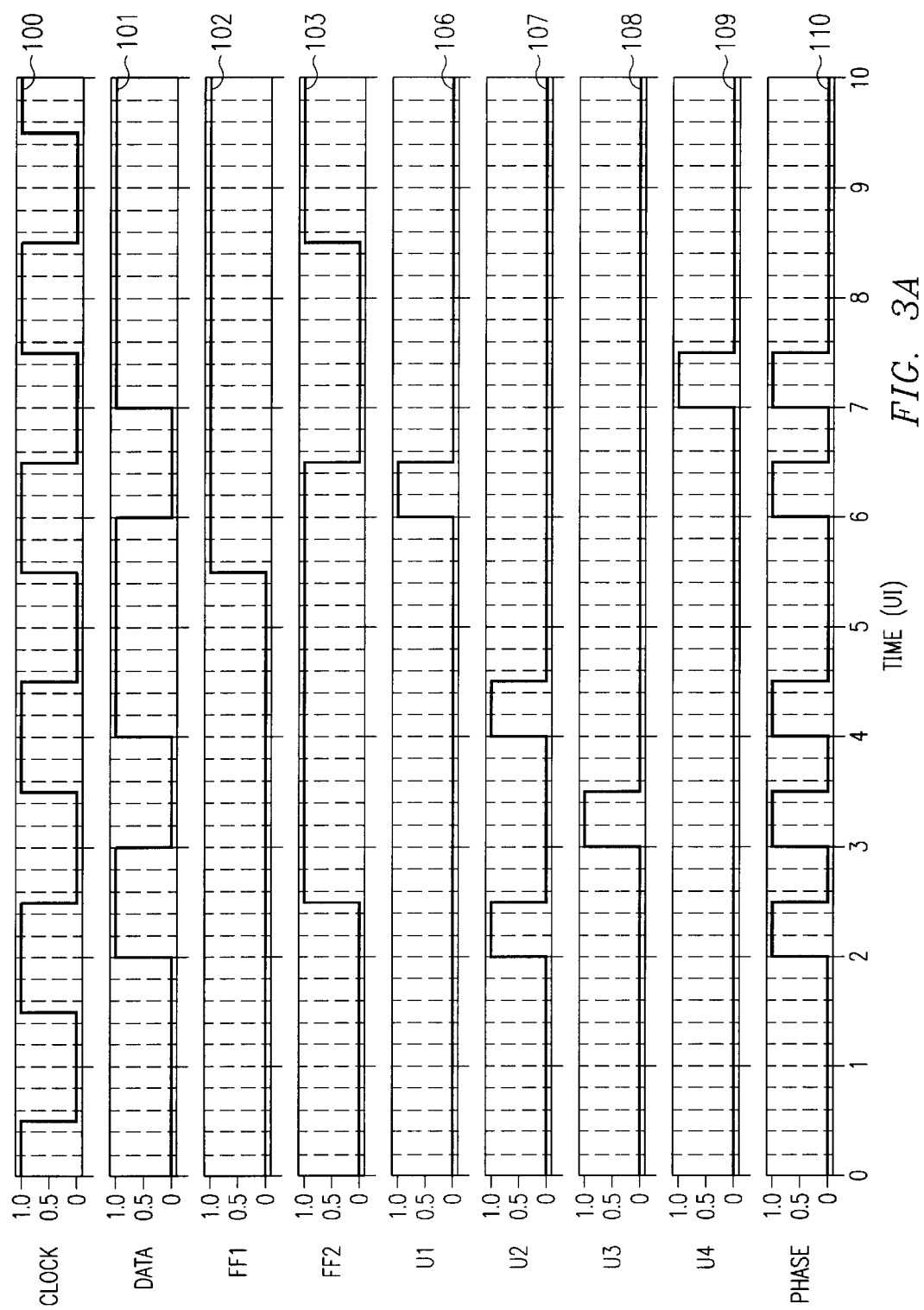
FIGS. 3A, 3B and 3C show timing diagrams for the circuit of FIG. 1.
Figure 3B:
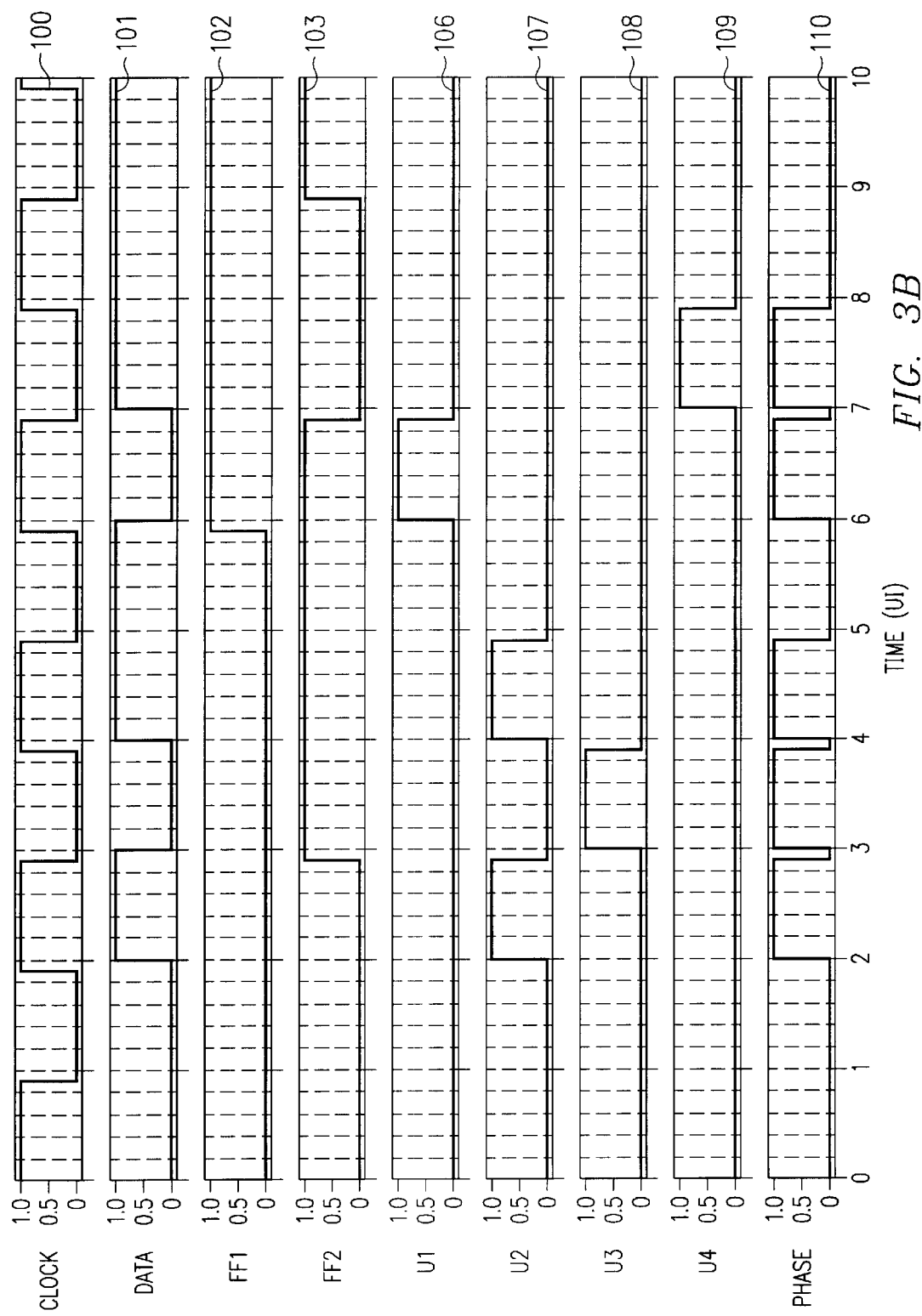
Figure 3C:
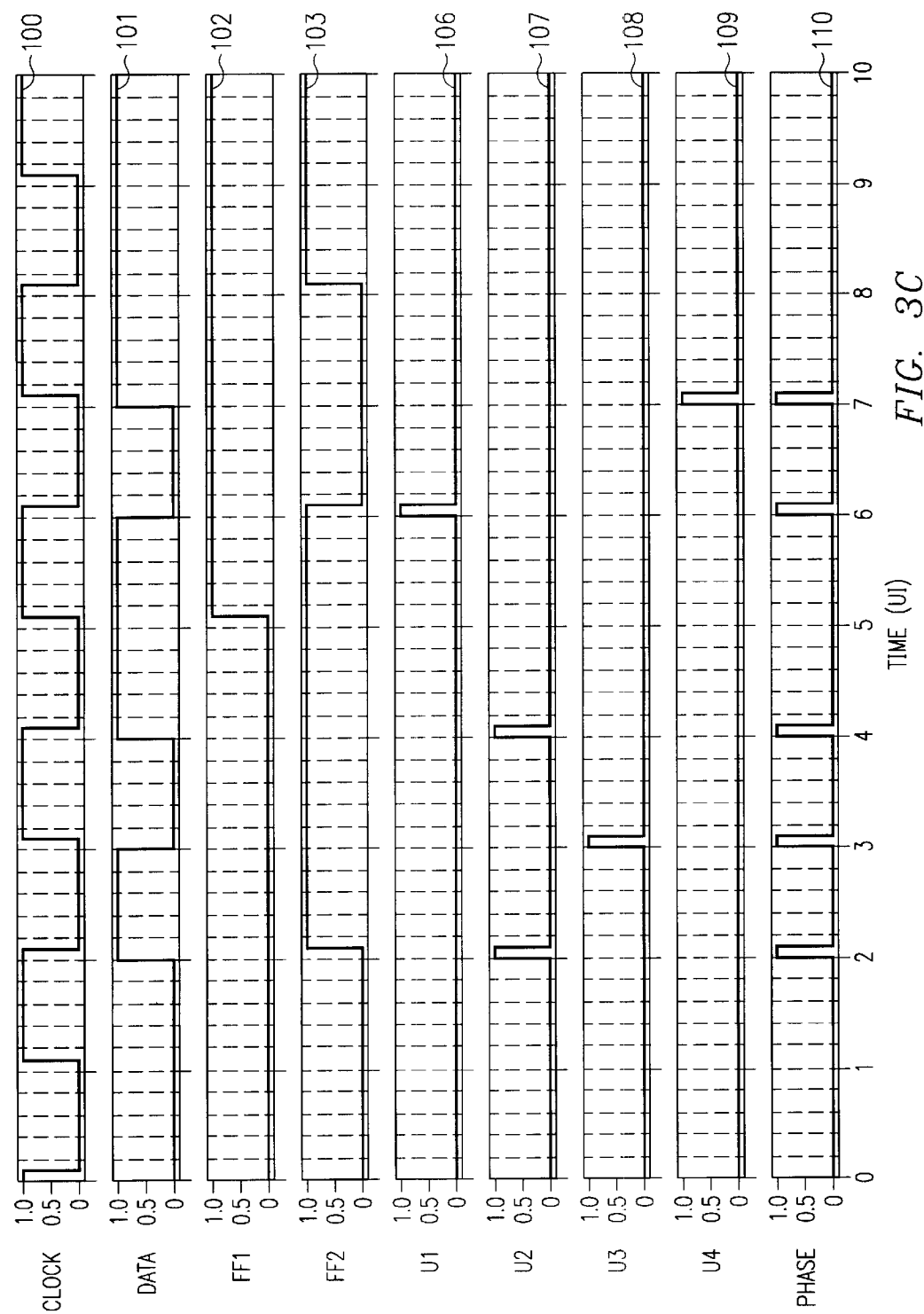

FIG. 3A shows the timing diagram (optimum clock phase) for circuit 10 (without optional low pass filters 120). Similarly, FIGS. 3B and 3C show the timing for late and early phase, respectively. To simplify the description, the delay τ through the flip-flop will be assumed to be zero. The effect of non-zero τ delay will be discussed hereinafter. As shown in FIG. 1, FF1 111 processes even data, and FF2 112 processes odd data. The retimed data (or complement thereof) is combined with the unretimed data (or complement thereof) and the clock (or complement thereof) in various combinations by AND gates 115–118 (U1–U4).

In the embodiment of FIG. 1, gate U1 generates a pulse at each even, negative transition. Gate U2 generates a pulse at each even, positive transition. Gate U3 generates a pulse at each odd, negative transition and gate U4 generates a pulse at each odd, positive transition. The duration of the pulses from gates U1–U4 is proportional to phase. The pulses are optionally low pass filtered by filter 120, then summed by linear combiner 121, resulting in a phase output that consists of a pulse proportional to phase at every data transition. Phase signal 110 in FIGS. 3A, 3B, and 3C is for the case of no low pass filter 120. The effect of a low pass filter will be discussed hereinafter. The output combining is explained in more detail below. This output is functionally the same as the outputs discussed above with respect to the prior art, and thus circuit 10 is a direct replacement therefore.

The theory of operation is best explained by first describing operation with a sequence of alternating 0's and 1's (ie 01010 . . . ), then describing what happens for other sequences. With a 0101 . . . pattern, one flip-flop 111 or 112 will always sample 0's and the other flip-flop will always sample 1's. Thus, assume the timing is such that FF1 is always 0 and FF2 is always 1. In this case, gates U1 and U4 will be disabled, and gates U2 and U3 will be effectively reduced to two input gates, driven by clock 100 (or its complement) and unretimed data 104 (or its complement). Gate U2 puts out pulses that begin on a positive data transition and end on a negative clock transition. Similarly, gate U3 puts out pulses that begin on a negative data transition and end on a positive clock transition. The U2 and U3 pulses alternate in time and are summed by combiner 121. The pulse duration depends on the time interval between data and clock, which is proportional to phase.

With other sequences, there are always at least two 0's preceding a 1 and two 1's preceding a 0. Suppose two or more consecutive 0's have been received by phase detector 10. Then both FF1 and FF2 will be low. In this case, gates U1 and U3 will be disabled, and gates U2 and U4 will be effectively reduced to two input gates. These gates will be enabled alternately one gate at a time by the clock and clock complement, which drive gates U2 and U4 respectively. Suppose the clock is low, hence gate U4 is enabled. When a 0 to 1 data transition occurs, gate U4 will go high, beginning an output pulse. When the clock goes high, gate U4 will go low, ending the output pulse. Additionally, FF1 will go high, which will disable gate U2, preventing it from initiating an additional output pulse In practice, patterns are mixtures of 0101 . . . sequences and other sequences. FIG. 3A shows that the circuit is able to transition between these sequences correctly.

No gate can be active during two consecutive UI's, because of the following mathematical properties: (1) positive and negative transitions always alternate (although there can be UI's in-between without transitions); (2) transitions occurring in consecutive UI's cannot both be even or both be odd. Therefore, any individual gate operates at half rate (or less), and always has at least 1 UI of dead time between pulses. Ideally, the outputs of gates U1–U4 could simply be combined by a four-input OR gate, (instead of the linear combiner actually used), to produce the phase output waveforms of FIGS. 3A–3C, since (ideally) only one gate is active at a time.

When the phase approaches ½ UI late, the pulses at the outputs of gates U1–U4 approach 1 UI in duration. In that case, when there are consecutive data transitions, there is very little time between the end of one pulse and the beginning of the next. In the idealized case shown in FIG. 3B, the phase output would contain narrow negative going pulses representing the time between output pulses. In practice, for a system operating near the capability of the logic hardware, this pulse would probably be too narrow to reproduce, resulting in the phase output staying high for an excessive period of time. As described previously, this is a significant problem for prior art phase detectors. However, the concepts taught herein overcome this limitation by taking advantage of the fact that the phase detector output is averaged over many pulses before being utilized. Because of this averaging, which can be thought of integration, the only requirement on the phase detector for accuracy is that the area under the pulses correctly indicates the phase. If this constraint is met, it is not necessary for the phase detector to accurately reproduce the theoretically correct pulse shape.

To be more specific, the area under the curve of phase output voltage 110 (FIG. 1) must be equal to the sum of the areas under the curves of individual gate outputs, 106, 107, 108, and 109. Linear combiner 121 will always met this requirement because of the mathematical property that the integral of a sum equals the sum of the constituent integrals. If the combiner 121 is passive, it is virtually guaranteed by design to be linear. Properly designed active combiners can also be linear. The bandwidth of the combiner would be dependent upon system usage and would typically be between 0–640 MHz when the system is operating at a data rule of 40 G bite/sec with a run length of 32 bits.

Figure 4:
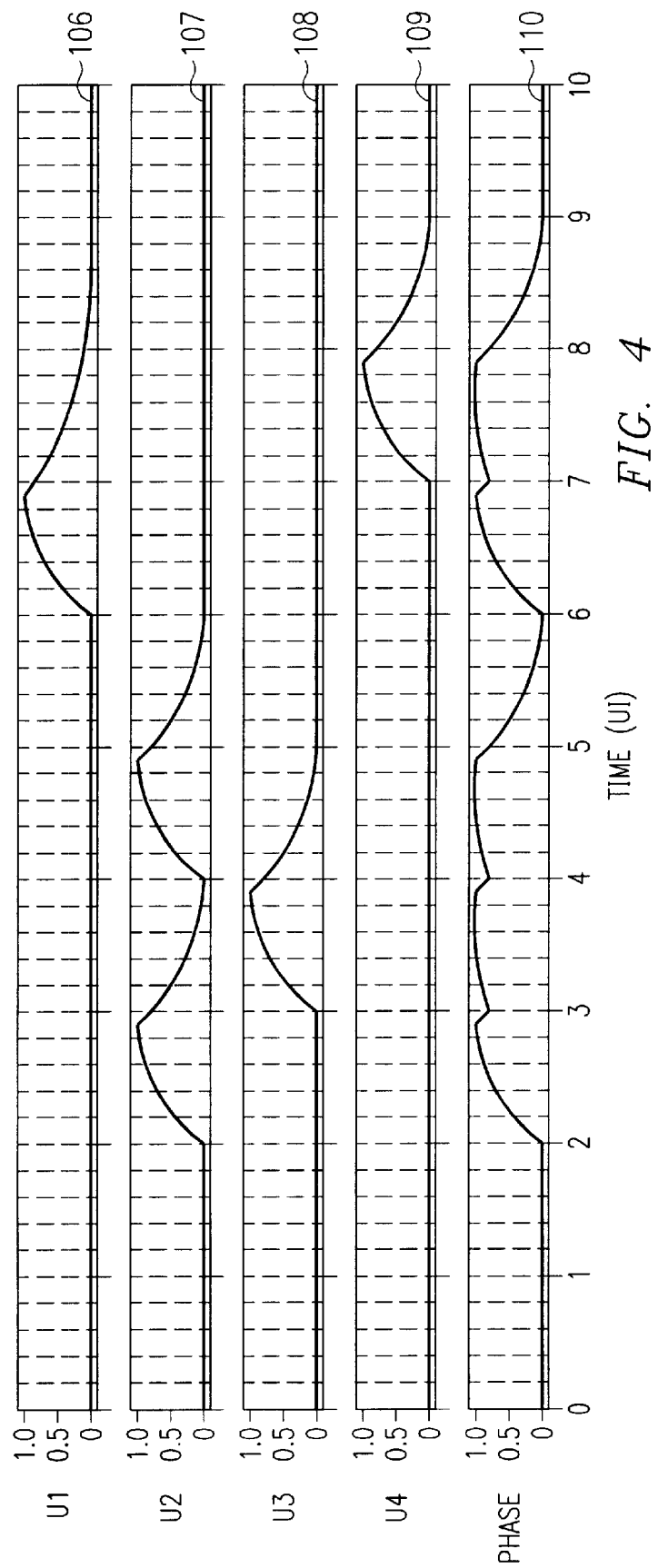
FIG. 4 shows timing diagrams of the circuit of FIG. 1 for the situation where the rise and fall time of the output pulses is significant.

FIG. 4 illustrates what happens when gate outputs 106, 107, 108, and 109 have non-zero rise and fall times. The pulses run together at phase output 110. However, the area will be correct for the reasons given above. This would not be the case if linear combiner 121 were replaced by a 4-input OR gate, since an OR gate is a non-linear device. An OR gate implementation would work over a reduced phase range and/or with reduced accuracy.

In some cases, there can be a problem with crosstalk between gate outputs 106, 107, 108, and 109 due to inadequate isolation between the inputs of linear combiner 121. The optional low pass filters 120, FIG. 1, can be used to prevent high speed transient pulses coming out of one gate from disrupting the operation of the other gates. These filters can either replace or supplement the low pass filters used downstream from the phase output. The presently contemplated range for the filter is 0–640 MHz.

The τ delay 113, 114 has two purposes. First, by making it equal to the propagation delay of the flip-flops, it has the effect of canceling out the delay. Note that all data flow in the phase detector is from input to output, without feedback, across reference plane 130, as shown in FIG. 1. Therefore, if delay 114 is inserted in the clock and delay 113 is inserted in the unretimed data path, this delay has the same effect as if a hypothetical negative delay had been inserted at the flip-flop outputs. This negative delay can be used to effectively cancel out the propagation delay of the flip-flops. Second, by adding an additional delay of ½ UI beyond the flip-flop delay, the timing margin is increased.

Figure 5A:
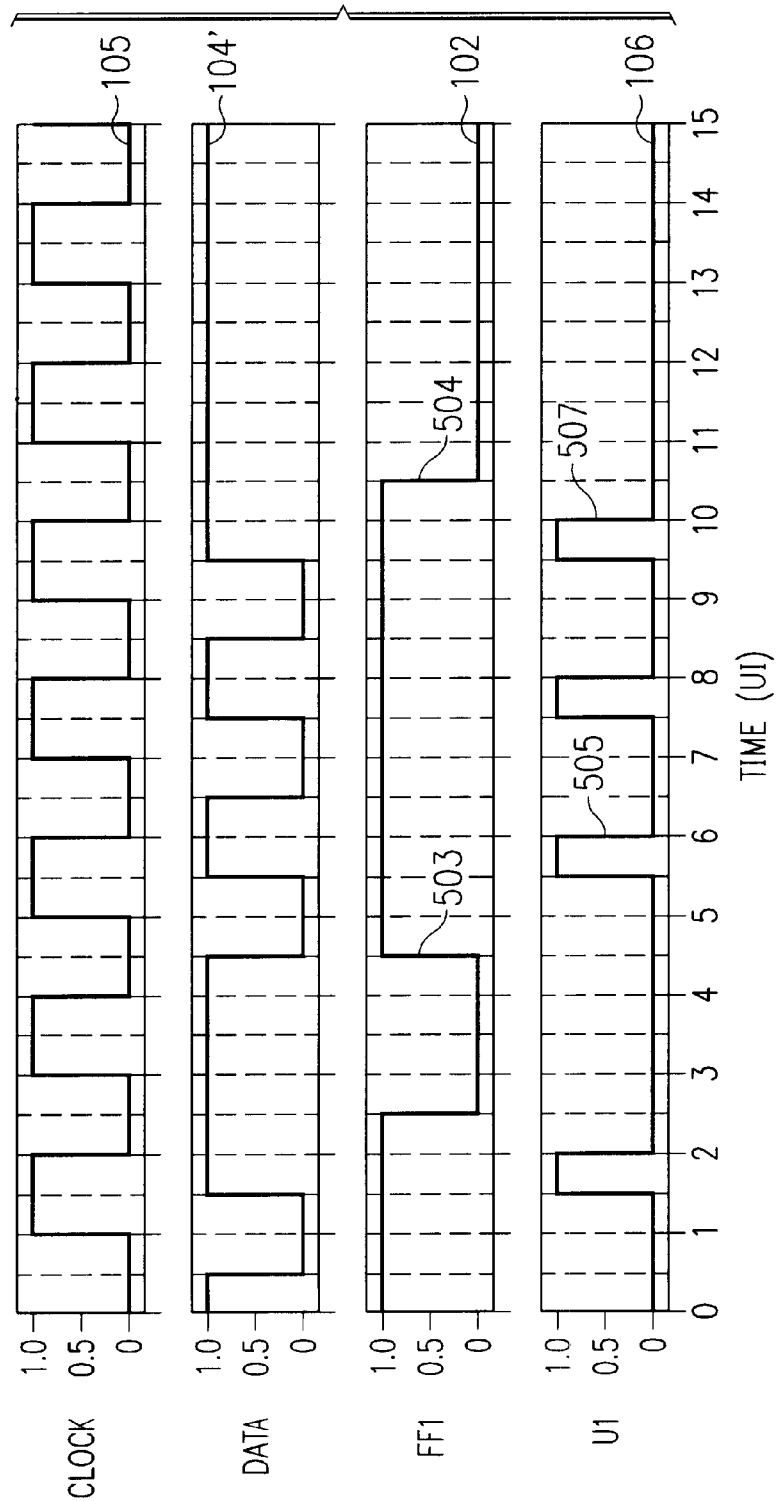
FIG. 5A shows a timing diagram of the circuit of FIG. 1 with nominal clock-phase and τ=0.5 UI+flip-flop delay.

FIG. 5A illustrates this situation for gate U1 115, which is representative of the other three phase output gates, with nominal clock phase. Output 106 and the three inputs (102, 104, 105), of this gate are shown. For illustrative purposes, the complement 104' of the delayed unretimed data 104 is displayed, to take into account the inversion bubble at the input to U1 115. Delayed clock 105 is also shown. FIG. 5A assumes that τ is exactly ½ UI longer than the propagation delay of flip-flop 101. Output 106 (U1) of the AND gate goes high if, and only if, all three inputs (102, 104', and 105) are high.

For the nominal phase case of FIG. 5A, the minimum flip-flop timing margin with respect to the leading edge of an output pulse is 1 UI. For example, pulse 505 begins at t=5.5 and ends at t=6.0. It is necessary for the output of FF1 102 to be high during the pulse 505. It can be seen that FF1 102 goes high at t=4.5 503, which is 1 UI earlier than necessary. FF1 102 then stays high for many UIs after the end of the pulse at t=5.5. Similarly, the minimum flip-flop timing margin with respect to the trailing edge of an output pulse is ½ UI. For example, pulse 507 begins at t=9.5 and ends at t=10. It is necessary for the output of FF1 102 to be high during the pulse 507. It can be seen that FF1 102 stays high until t=10.5 504, which is ½ UI later than necessary. FF1 102 had also been high for many UI before the beginning of the pulse at t=9.5.

Figure 5B:
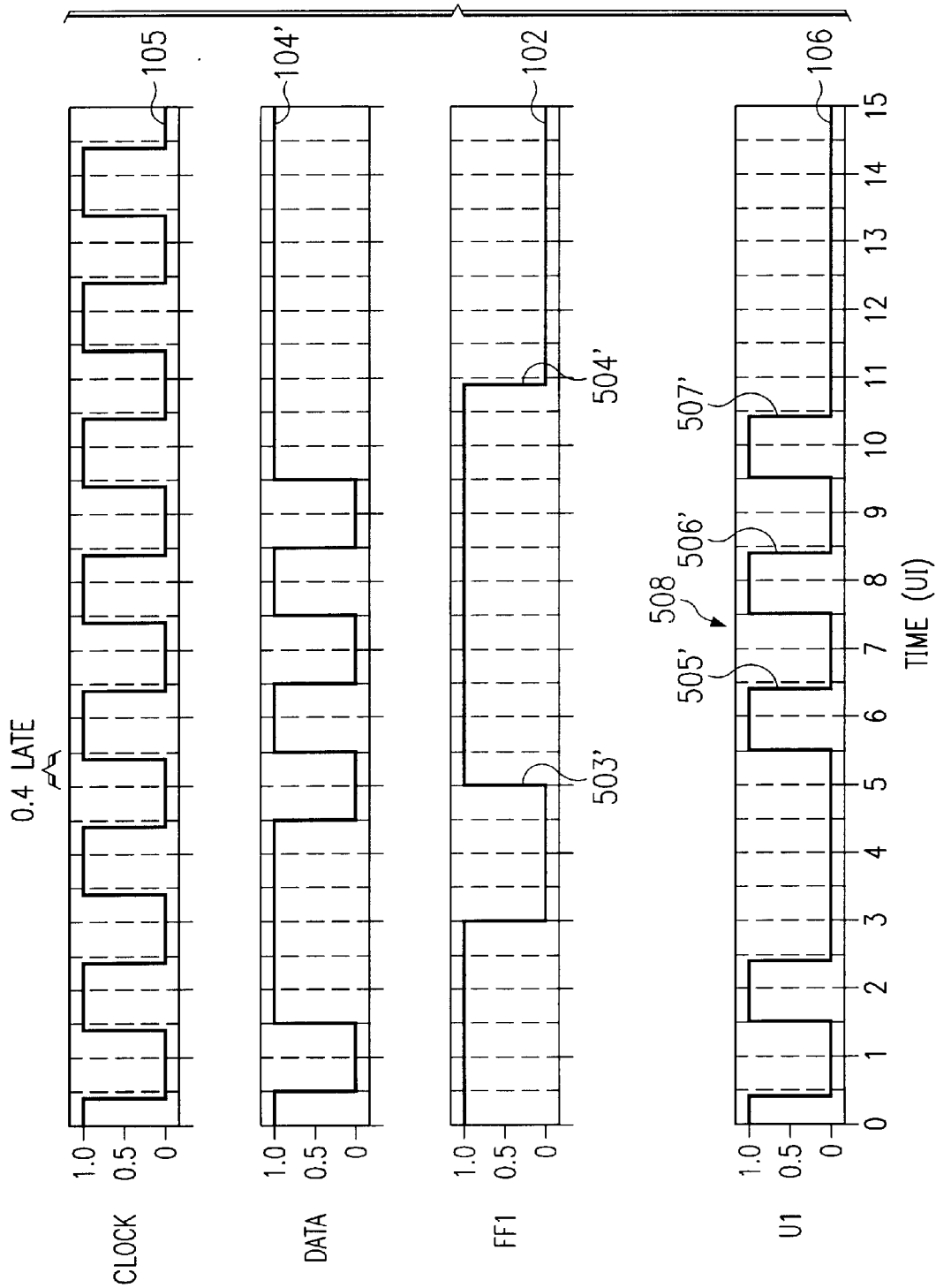
FIG. 5B shows a timing diagram of the circuit of FIG. 1 with a 0.4 UI late clock phase and τ=0.5 UI+flip-flop delay.

FIG. 5B shows how the waveforms change when the clock phase is 0.4 UI late. The output pulses (505', 506' and 507') are now 0.9 UI long. The minimum flip-flop timing margin with respect to the leading edge of an output pulse has been reduced to 0.6 UI. For example, pulse 505' begins at t=5.5 and ends at t=6.4. The output 102 of FF1 111 goes high at t=4.9 503', which is 0.6 UI earlier than necessary. The output 102 of FF1 111 then stays high for many UI after the end of the pulse at t=6.4. Similarly, the minimum flip-flop timing margin with respect to the trailing edge of an output pulse is ½ UI. For example, pulse 507' begins at t=9.5 and ends at t=10.4. It is necessary for the output 102 of FF1 111 to be high during pulse 507'. It can be seen that output 102 of FF1 111 stays high until t=10.9 504', which is ½ UI later than necessary. The output 102 of FF1 111 had also been high for many UI before the beginning of the pulse at t=9.5

Since the accuracy of the phase detector is independent of flip-flop propagation delay, it will also be independent of pattern jitter caused by the flip-flops. This is an important consideration when the application is jitter measurement.

If the phase detector is to be used at multiple clock rates, the conversion from UI to absolute seconds is made on the basis of the maximum data rate to be used. It is not necessary to increase $\tau$ at rates below the maximum. The circuit will work at least as well at lower rates as it does at the maximum, if the value of $\tau$ is chosen based on the maximum rate.

Figure 6:
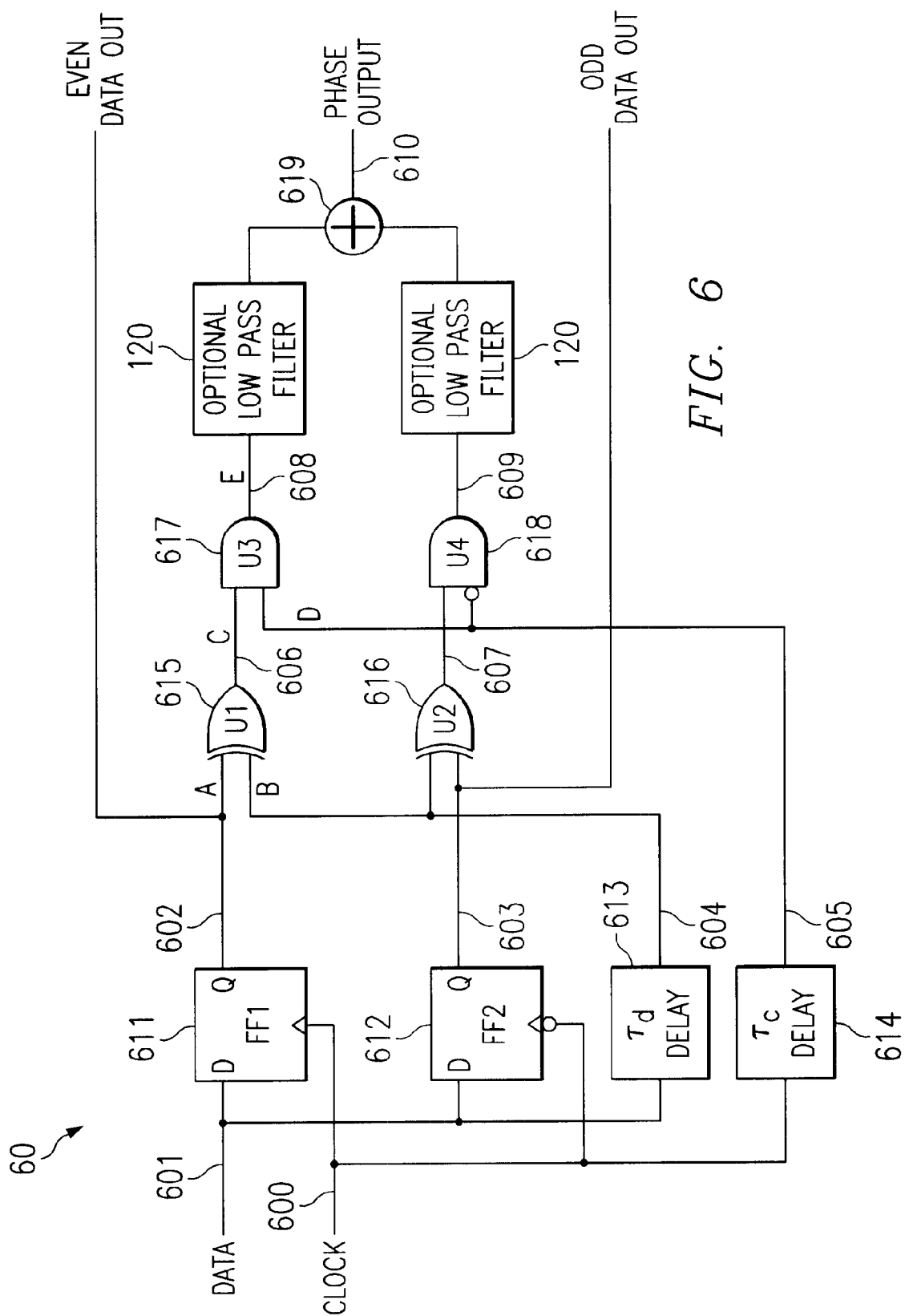
FIG. 6 shows another embodiment of the invention.

FIG. 6 shows one alternate embodiment 60, the need for which arises because of the fact that some commonly used high-speed logic technologies, such as differential current mode logic (CML), are not amenable to 3-input gates. In technologies such as these, a 3-input function needs to be implemented as a cascade of two 2-input functions. A straightforward implementation of this concept would convert each 3-input gate to a cascade of two 2-input gates, resulting in a total of eight 2-input gates replacing the original four 3-input gates. However, FIG. 6 shows a more efficient implementation using just two 2-input AND gates 617 and 618 (U3 and U4) and two exclusive-OR gates 615 and 616 (U1 and U2). Circuit 60 is logically equivalent to circuit 10 (FIG. 1). In this case, there are only two output gates for the phase output. As with circuit 10, all logic of circuit 60 operates at half rate or less.

Figure 7:
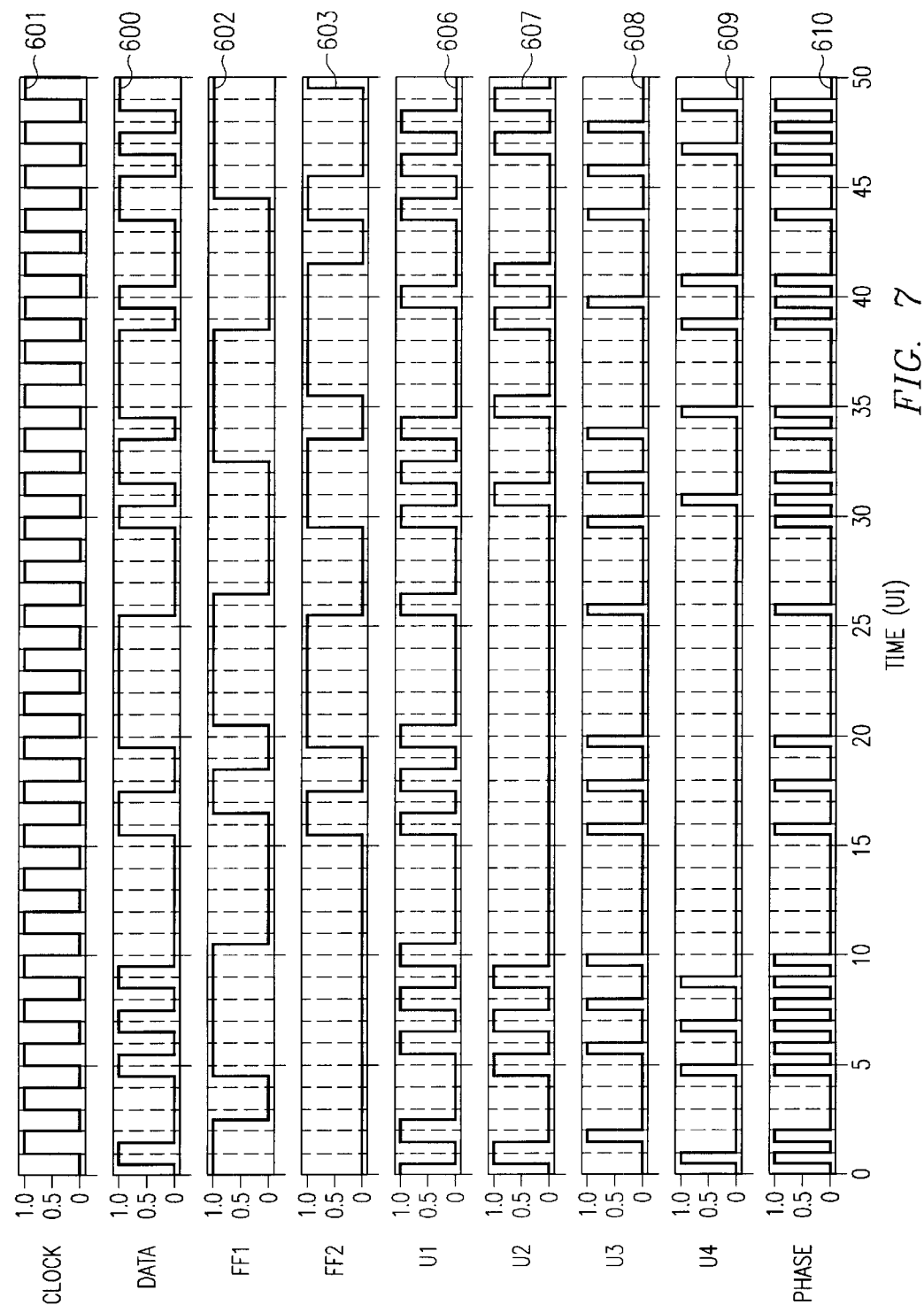
FIGS. 7 and 8 show timing diagrams of the circuit of FIG. 6.

FIG. 7 shows the timing diagram for circuit 60. As with circuit 10, the theory of operation is best explained by describing operation with a pattern of alternating 0's and 1's (ie 0101 . . . ) first, then describing what happens for other patterns. With a 0101 . . . pattern, one flip-flop 611 or 612 will always sample 0's and the other flip-flop will always sample 1's. Suppose a 0101 . . . pattern is received by the phase detector with timing such that output 602 of FF1 611 is always 0 and output 603 of FF2 612 is always 1. In this case, gate U1 615 is effectively reduced to a non-inverting buffer and gate U2 616 is effectively reduced to an inverter. The operation of gates U3 617 and U4 618 driven by delayed clock 605 (delayed by 614) and its complement and unretimed data 606 and its complement 607 is then the same as for circuit 10. Output 608 of gate U3 617 contains pulses that begin on a positive data transition and end on a negative clock transition. Similarly, output 609 of gate U4 618 contains pulses that begin on a negative data transition and end on a positive clock transition. Gates U3 617 and U4 618 pulse alternately in time and are summed by combiner 619 resulting in phase output 610. The pulse duration depends on the time interval between data and clock, as was the case with circuit 10.

With other patterns, there are always at least two 0's preceding a 1 and two 1's preceding a 0. Suppose two or more consecutive 0's have been received by phase detector 60. Then output 602 of FF1 611 and output 603 of FF2 will be low. In this case, gates U1 615 and U2 616 will be effectively reduced to non-inverting buffers. Gates U3 617 and U4 618 will be enabled alternately for one UI at a time by the clock signal and clock complement. Suppose the delayed clock 605 is low, hence gate U4 618 is enabled. When a 0 to 1 transition occurs in the delayed unretimed data 604, output 609 of gate U4 will go high, beginning an output pulse. When the delayed clock 605 goes high, output 609 of gate U4 will go low, ending an output pulse. Additionally, output 602 of FF1 611 will go high, which will disable gate U3 617 via gate U1 615, preventing it from initiating an extra output pulse.

The discussion of timing-margins, regarding circuit 10 basically also applies to timing-margins with respect to FIG. 7 of circuit 60, except for the time delays. Instead of the same delay, $\tau$, for both unretimed data 600 and clock 601, there are now individually chosen delays, $\tau_d$ and $\tau_c$, respectively with respect to circuits 613 and 614. $\tau_d$ is the same as $\tau$ in circuit 10. However, $\tau_c$ is equal to $\tau$ plus the propagation delay of an exclusive-OR gate, to make up for the delay through gates U1 615 and U2 616.

Figure 8:
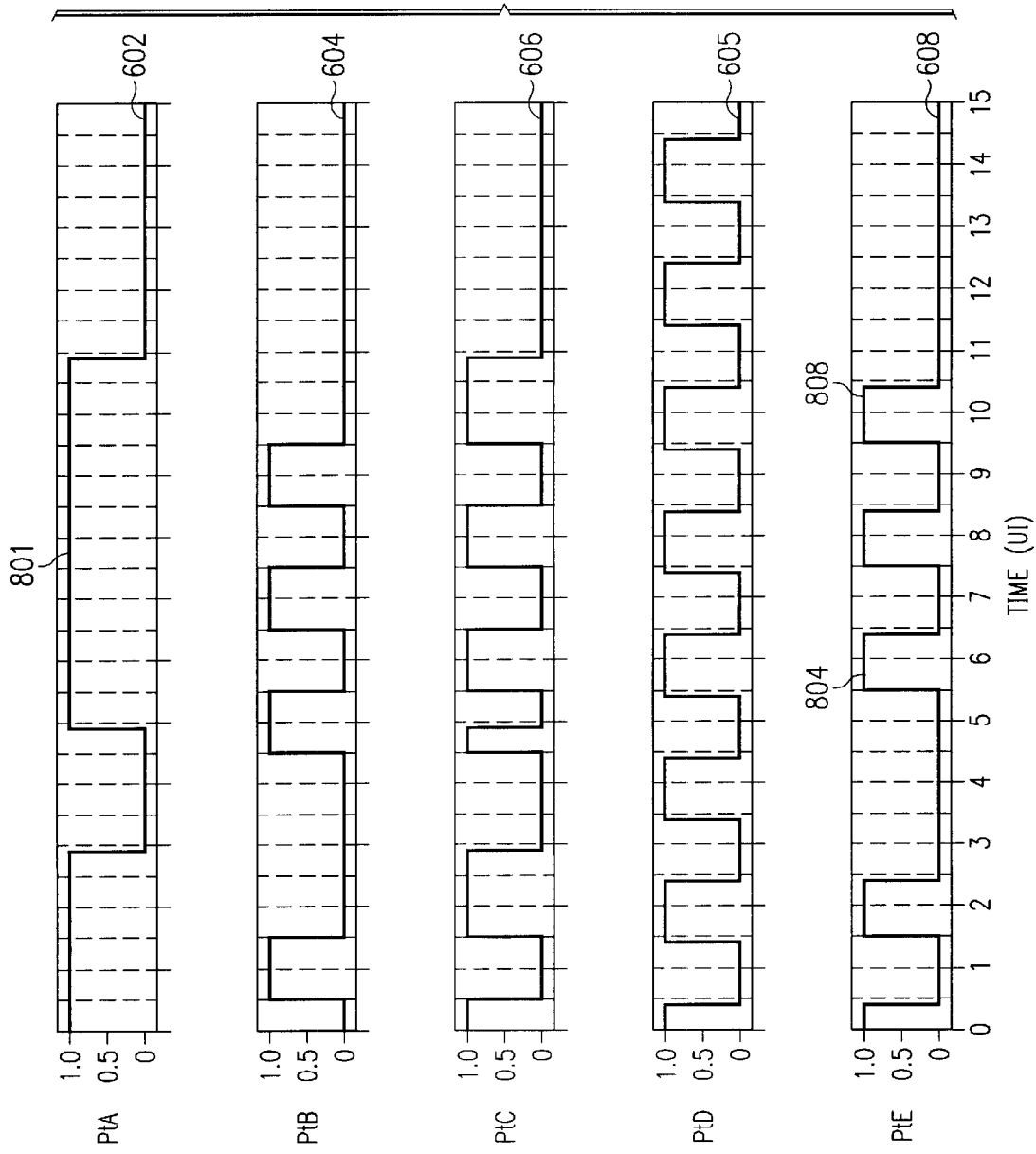

FIG. 8 shows critical timing relationships, using correct values of $\tau_d$ and $\tau_c$, for the worse case of 0.4 U1 late clock phase. The output pulse width is still independent of small variations (up to ½ UI) in the flip-flop propagation delay, and is immune to flip-flop jitter.

In FIG. 8, the reference points A, B, C, D and E are, with respect to FIG. 6, and $\tau_c$, is 0.5 UI+flip-flop delay and $\tau_d$ is 0.5 UI+flip-flop delay+exclusive OR delay. Following along the lines of circuit 10, the minimum flip-flop timing margin with respect to the leading edge of an output pulse is 0.6 UI. For example, output pulse 804 at point E 608 begins at t=5.5 and ends at t=6.4. The output 602 of FF1 611 at point A goes to create pulse 801 high at t=4.9, which is 0.6 UI earlier than necessary. Pulse 801 then stays high for many UI after the end of the pulse at t=6.4. Similarly, the minimum flip-flop timing margin with respect to the trailing edge of an output pulse is ½ UI. For example, pulse 802 begins at t=9.5 and ends at t=10.4. It is necessary for pulse 801 to be high during the 802 pulse. It can be seen that the output 602 of FF1 611 (pulse 801) stays high until t=10.9, which is ½ UI later than necessary. Pulse 801 had also been high for many UIs before the beginning of pulse 802 at t=9.5.

Note that reference output 1805 described with respect to circuit 10 can easily be added to circuit 60 as discussed above.

It should be noted that because of the division of labor of the output gates, it is possible to utilize them individually, or in various pairs, rather than summing all their outputs together. For example, it may be desirable to have available the phase error of the positive transitions separately from the negative transitions. This would be important, by way of example, if there are asymmetrical impairments that affect one polarity more than another. Similarly, it may be desirable to have available the phase error of the even transitions separately from the odd transitions. If the data is generated by multiplexing up, as is usually the case, there could easily be systematic phase differences between even and odd data.

It is also possible to simplify the circuit by building only a subset of the circuitry and recovering the clock from a subset of the transitions. In this case the assumption would be that the positive transitions only, or even transitions only, etc. are sufficiently representative of all transitions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. For example, while two embodiments (FIGS. 1 and 6) have been shown which allow for the logical combination of data input, retimed data signals and clock signals any number and combination of other logical elements, such as AND gates, OR gates, XOR gates, or other elements, such as, for example, flip-flops, retimers and latches, can be used to generate consecutive pulses which are not generated by the same hardware (thus avoiding overlap or near-overlap) and which can be averaged over a number of signal pulses. Such alternative circuit configurations, which can be arrived at by starting with the desired pulse output characteristics and working backward to achieve a properly functioning combination of elements, will allow circuit designers design freedom to match the actual circuit to specific design criterion or overall circuit limitations. This can become important if signal timing factors or signal propagation delays become critical.

As one of skilled in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. Circuitry for providing an output representative of the signals and clock signals, said circuitry comprising:
    means for separately retiming even and odd ones of said input data signals so as to provide even retimed data signals and odd retimed data signals;
    means for logically combining each of said retimed even and odd data signals separately with said data signals and with said clock signals and with the inverse of said clock signals; and
    means for combining said last-mentioned logically combined signals to provide said output.

2. The circuitry of claim 1 wherein said last-mentioned combining means is a linear combiner.

3. The circuitry of claim 1 wherein said logically combining means comprises a plurality of three-input AND gates.

4. The circuitry of claim 1 wherein said gates comprise at least four, three-input AND gates whereby:
    a first input of a first gate and a first input of a third gate are said unretimed data signals that have been inverted;
    a second input of said first gate is said even retimed data signal;
    a second input of a second gate is said even retimed data signal inverted;
    a third input of said first gate is said clock signal;
    a first input of said second gate and a first input of a fourth gate is said unretimed data signal;
    a second input of said third gate is said odd retimed data signal;
    a second input of said fourth gate is said odd retimed data signal inverted; and
    a third input of said third gate and a third input of said fourth gate is said clock signal inverted.

5. The circuitry of claim 1 wherein said logically combining means comprises a plurality of two-input exclusive OR gates followed by a plurality of two-input AND gates.

6. The circuitry of claim 1 wherein said gates comprise at least two, two-input AND gates and at least two two-input exclusive OR gates whereby:
    a first input of a first exclusive OR gate is said even retimed data signals;
    a second input of said first exclusive OR gate and a first input of a second OR gate is said unretimed data signals;
    a second input of said second exclusive OR gate is said odd retimed data signals;
    a first input to a first AND gate is the output of said first exclusive OR gate;
    a second input to said first AND gate is said clock signal;
    a first input to a second AND gate is the output of said second exclusive OR gate; and
    a second input to said second AND gate is said clock signal inverted.

7. The circuitry of claim 5 wherein said data signals are delayed an amount $\tau_1$ to compensate for signal delay through said retiming circuit and said clock signals are delayed an amount $\tau_2$ to compensate for signal delay through said retiming circuit and said exclusive OR gates.

8. The circuitry of claim 2 further comprising:
    at least one low-pass filter interposed between said logically combined signals and said combining means.

9. The circuitry of claim 8 wherein said low-pass filter passes 0–640 MHz.

10. The circuitry of claim 1 further comprising:
    means for using said even and odd retimed data signals to provide a reference output.

11. The circuitry of claim 1 wherein even and odd retimed data signals are provided to inputs of an exclusive OR gate to provide a reference output.

12. The circuitry of claim 1 wherein said data signals and said clock signals are delayed an amount $\tau$ to compensate for signal delay through said retiming means.

13. A phase detector comprising:
    an input for receiving data signals;
    an input for receiving clock signals;
    circuitry for retiming data received at said data input;
    a plurality of multi-input gates, said gate inputs arranged in conjunction with different combinations of data signals retimed by said retiming circuitry, with unretimed data signals, with clock signals received from said clock input; and with the inverse of said clock signals, such that the linearly combined output of said gates is a signal at said output for providing pulses proportional to the phase difference between said data pulses received at said data input and clock pulses received said clock input.

14. The phase detector of claim 13 further comprises:
    delay circuitry for delaying said unretimed data signals prior to said unretimed data signals arriving at said gate inputs.

15. The phase detector of claim 14 wherein the amount of said delay is a function of the delay of said retiming circuitry.

16. The phase detector of claim 13 further comprises:
    at least one delay circuitry for delaying said clock signals prior to said clock signals arriving at said gate inputs.

17. The phase detector of claim 16 wherein the amount of said delay is a function of the delay of said retiming circuitry.

18. The phase detector of claim 14 wherein said clock signals are delayed prior to said clock signals arriving at said gate inputs.

19. The phase detector of claim 18 wherein said delay of said clock signals equals the delay of said unretimed data signals.

20. The phase detector of claim 18 wherein said delay of said clock signals is different than the delay of said unretimed data signals.

21. The phase detector of claim 13 further comprising a filter for removing high frequency components from said gate output signals prior to linearly combining said gate output signals.

22. The phase detector of claim 19 wherein said filter is optimized to pass 0 to 640 MHz.

23. The phase detector of claim 11 wherein said unretimed data signals operate to start an output pulse, said clock signals operate to end said output pulse and said retimed data signals operate to enable said unretimed data signals and said clock signals.

24. The phase detector of claim 11 wherein said data retiming circuitry includes individually retiming even and odd data signals received at said data input and for providing separate outputs of said even and odd retimed data to said gate inputs.

25. The phase detector of claim 22 wherein the length of time allocated to a single bit is UI and wherein no said gate can be active in two consecutive UI's.

26. The phase detector of claim 22 wherein said gates comprise three-input AND gates.

27. The phase detector of claim 24 wherein said gates comprise at least four, three-input AND gates whereby:

a first input of a first gate and a first input of a third gate are said unretimed data signals that have been inverted;

a second input of said first gate is said even retimed data signal;

a second input of a second gate is said even retimed data signal inverted;

a third input of said first gate is said clock signal;

a first input of said second gate and a first input of a fourth gate is said unretimed data signal;

a second input of said third gate is said odd retimed data signal;

a second input of said fourth gate is said odd retimed data signal inverted; and a third input of said third gate and a third input of said fourth gate is said clock signal inverted.

28. The phase detector of claim 27 wherein said clock signal and said unretimed data signal is delayed by time $\tau$.

29. The phase detector of claim 28 wherein $\tau$ is equal to the delay of a data signal through said data retiming circuitry.

30. The phase detector of claim 24 wherein said gates comprise at least two AND gates and at least two two-input exclusive OR gates whereby:

a first input of a first exclusive OR gate is said even retimed data signals;

a second input of said first exclusive OR gate and a first input of a second exclusive OR gate is said unretimed data signals;

a second input of said second exclusive OR gate is said odd retimed data signals;

a first input to a first AND gate is the output of said first exclusive OR gate;

a second input to said first AND gate is said clock signal;

a first input to a second AND gate is the output of said second exclusive OR gate; and a second input to said second AND gate is said clock signal inverted.

31. The phase detector of claim 30 wherein said clock signal is delayed by $\tau_1$ and said unretimed data signal is delayed by $\tau_2$.

32. The phase detector of claim 31 where $\tau_1$ is the delay of a data signal through said data retiming circuitry plus the delay of a signal through said exclusive OR gate.

33. The phase detector of claim 31 where $\tau_2$ is the delay of a data signal through said data retiming circuitry.

34. The phase detector of claim 31 wherein $\tau_1$ is the delay of a data signal through said data retiming circuitry plus the delay of a signal through said exclusive OR gate, and wherein $\tau_2$ is the delay of a data signal through said data retiming circuitry.

35. The phase detector of claim 30 wherein said combined outputs comprise only the outputs of said AND gate.

36. A phase detector comprising:

an input for receiving data signals;

an input for receiving clock signals;

an output for providing phase control signals;

data retiming circuiting for accepting unretimed data signals from said data input and for providing even and odd retimed signals therefrom;

a plurality of gates having inputs connected to different combinations of said unretimed data signals, said retimed data signals, and said clock signals, such that no said gate can be active in two consecutive UIs, when a UI is defined as the length of time allocated to a single bit; and a combiner for mixing the outputs of at least two of said gates.

37. The phase detector of claim 36 wherein said combiner is linear in the range of 0–640 MHz.

38. The phase detector of claim 37 wherein said gates are four three-input AND gates.

39. The phase detector of claim 38 wherein said clock signal and said unretimed data signal are delayed by time $\tau$.

40. The phase detector of claim 36 wherein $\tau$ is equal to the delay of a data signal through said data retiming circuitry.

41. The phase detector of claim 36 wherein said gates are two two-input exclusive OR gates feeding into two two-input AND gates.

42. The phase detector of claim 41 wherein said clock signal is delayed by $\tau_1$ and said unretimed data signal is delayed by $\tau_2$.

43. The phase detector of claim 42 where $\tau_1$ is the delay of a data signal through said data retiming circuitry plus the delay of a signal through said OR gate.

44. The phase detector of claim 42 where $\tau_2$ is the delay of a data signal through said data retiming circuitry.

45. The phase detector of claim 42 wherein $\tau_1$ is the delay of a data signal through said data retiming circuitry plus the delay of a signal through said OR gate, and wherein $\tau_2$ is the delay of a data signal through said data retiming circuitry.

46. Circuitry for determining phase between a data signal and a clock signal, said circuitry comprising:

a first circuit for retiming provided even data signals;

a second circuit for retiming provided odd data signals;

a plurality of three-input AND gates;

a first input of a first gate and a first input of a third gate is said unretimed data signal that has been inverted;

a second input of said first gate is said even retimed data signal;

a second input of a second gate is said even retimed data signal inverted;

a third input of said first gate is said clock signal;

a first input of said second gate and a first input of a fourth gate is said unretimed data signal;

a second input of said third gate is said odd retimed data signal;

a second input of said fourth gate is said odd retimed data signal inverted a third input of said third gate and a third input of said fourth gate is said clock signal inverted; and a combiner for summing the outputs from said AND gates.

47. The circuitry of claim 46 wherein said combiner is linear.

48. The circuitry of claim 46 further comprising means for combining said even data signals and said odd data signals as a reference output.

49. The circuitry of claim 46 wherein said clock signal and said unretimed data signal is delayed by time $\tau$.

50. The circuitry of claim 49 wherein $\tau$ is equal to the delay of a data signal through said data retiming circuitry.

51. The circuitry of claim 46 further comprising:

a filter interposed between said AND gates and said combiner.

52. The circuitry of claim 51 wherein said filter is optimized to pass 0–640 MHz.

53. Circuitry for determining phase between a data signal and a clock signal, said circuitry including:

a first circuit for retiming provided even data signals;

a second circuit for retiming provided odd data signals;

a plurality of three-input AND gates;

a plurality of two-input exclusive OR gates and a plurality of two-input AND gates;

a first input of a first exclusive OR gate is said even retimed data signals;

a second input of said first exclusive OR gate and a first input of a second exclusive OR gate is said unretimed data signals;

a second input of said second exclusive OR gate is said odd retimed data signals;

a first input to a first AND gate is the out put of said first exclusive OR gate;

a second input to said fist AND gate is said clock signal;

a first input to a second AND gate is the output of said second exclusive OR gate;

a second input to said second AND gate is said clock signal inverted; and a combiner for summing the outputs of said AND gates.

54. The circuitry of claim 53 wherein said combiner is linear in the range of 0–640 MHz.

55. The phase detector of claim 53 wherein $\tau$ is equal to the delay of a data signal through said data retiming circuitry.

56. The phase detector of claim 53 wherein said gates comprise at least two AND gates and at least two input exclusive OR gates whereby:

a first input of a first exclusive OR gate is said even retimed data signals;

a second input of said first exclusive OR gate and a first input of a second exclusive OR gate is said unretimed data signals;

a second input of said second exclusive OR gate is said odd retimed data signals;

a first input to a first AND gate is the out-put of said first exclusive OR gate;

a second input to said first AND gate is said clock signal;

a first input to a second AND gate is the output of said second exclusive OR gate; and a second input to said second AND gate is said clock signal inverted.

57. The phase detector of claim 56 wherein said clock signal is delayed by $\tau_1$ and said unretimed data signal is delayed by $\tau_2$.

58. The phase detector of claim 56 where $\tau_1$ is the delay of a data signal through said data retiming circuitry plus the delay of a signal through said OR gate.

59. A circuit for providing an output indicative of the phase difference between a data signal and a clock signal, said circuit comprising:

a plurality of logic elements for combining combinations of said data signals, retimed data signals and clock signals, to provide a series of pulses indicative of said phase difference, said combination combined such that consecutive pulses are not generated by the same logic element; and a combiner for averaging said series of pulses over a plurality of data signal pulses.

60. The circuitry of claim 59 wherein said combiner is a linear combiner.

61. The circuitry of claim 59 wherein said combiner is linear over the range of 0–640 MHz.

62. The circuitry of claim 59 further comprising:

circuitry for providing delayed data signals and delayed clock signals, said delayed signals provided to said logic elements for combining with said data signals, said retimed data signals and said clock signals.

63. The circuitry of claim 62 further comprising:

at least one filter interposed between said at least one of said logic elements and said combiner.

64. The circuitry of claim 63 wherein said filter is a low pass filter.

65. The circuitry of claim 63 wherein said filter is a low pass filter optimized between 0–640 MHz.

* * * * *